(12) United States Patent
Kubota et al.

(10) Patent No.: US 10,427,404 B2
(45) Date of Patent: Oct. 1, 2019

(54) LIQUID EJECTING HEAD CHIP, LIQUID EJECTING HEAD, AND LIQUID EJECTING APPARATUS

(71) Applicant: SII Printek Inc., Chiba-shi, Chiba (JP)

(72) Inventors: Yuzuru Kubota, Chiba (JP); Daichi Nishikawa, Chiba (JP)

(73) Assignee: SII PRINTEK INC., Chiba-Shi, Chiba (JP)

( * ) Notice: Subject to any disclaimer, the term of this patent is extended or adjusted under 35 U.S.C. 154(b) by 0 days.

(21) Appl. No.: 15/883,837

(22) Filed: Jan. 30, 2018

(65) Prior Publication Data
US 2018/0222195 A1    Aug. 9, 2018

(30) Foreign Application Priority Data

Feb. 3, 2017 (JP) .................. 2017-018234

(51) Int. Cl.

| | |
|---|---|
| *B41J 2/14* | (2006.01) |
| *B41J 2/16* | (2006.01) |
| *B41J 2/145* | (2006.01) |
| *B41J 2/155* | (2006.01) |
| *H01L 41/047* | (2006.01) |
| *H01L 41/09* | (2006.01) |
| *H01L 41/187* | (2006.01) |
| *H01L 41/29* | (2013.01) |
| *H01L 41/332* | (2013.01) |
| *H01L 41/338* | (2013.01) |

(52) U.S. Cl.
CPC ........ *B41J 2/14201* (2013.01); *B41J 2/145* (2013.01); *B41J 2/14209* (2013.01); *B41J 2/155* (2013.01); *B41J 2/1609* (2013.01); *B41J 2/1623* (2013.01); *B41J 2/1629* (2013.01); *B41J 2/1631* (2013.01); *B41J 2/1632* (2013.01); *B41J 2/1634* (2013.01); *B41J 2/1643* (2013.01); *B41J 2002/14491* (2013.01); *B41J 2202/18* (2013.01); *H01L 41/0475* (2013.01); *H01L 41/0973* (2013.01); *H01L 41/1876* (2013.01); *H01L 41/29* (2013.01); *H01L 41/332* (2013.01); *H01L 41/338* (2013.01)

(58) Field of Classification Search
CPC .... B41J 2/14201; B41J 2/14209; B41J 2/145; B41J 2/155; B41J 2/1609; B41J 2/1623; B41J 2/1629
See application file for complete search history.

(56) References Cited

FOREIGN PATENT DOCUMENTS

| EP | 2130678 A1 | 12/2009 |
|---|---|---|
| JP | H07-137245 A | 5/1995 |
| JP | H10-217467 A | 8/1998 |

OTHER PUBLICATIONS

Extended European Search Report for European Application No. 18155001.3, dated Jun. 14, 2018, pp. 1-13.

*Primary Examiner* — Jason S Uhlenhake
(74) *Attorney, Agent, or Firm* — Brinks Gilson & Lione

(57) ABSTRACT

According to an embodiment, a liquid ejecting head chip includes an actuator plate, a cover plate, a common electrode, and a connection wiring. In the actuator plate, a plurality of discharge channels and a plurality of non-discharge channels which extend in a Z-direction are alternately arranged at a distance in an X-direction. The cover plate is stacked on an AP-side-Y-direction inner side surface, so as to close the plurality of discharge channels and the plurality of non-discharge channels. The common electrode is formed on an inner surface of each of the discharge channels. The connection wiring is divided so as to be formed in at least 3 or more places in the X-direction on the cover plate, and the common electrode connects the connection wiring to the flexible substrate.

13 Claims, 19 Drawing Sheets

LIQUID EJECTING HEAD CHIP, LIQUID EJECTING HEAD, AND LIQUID EJECTING APPARATUS

RELATED APPLICATIONS

This application claims priority under 35 U.S.C. § 119 to Japanese Patent Application No. 2017-018234 filed on Feb. 3, 2017, the entire content of which is hereby incorporated by reference.

BACKGROUND OF THE INVENTION

Field of the Invention

The present invention relates to a liquid ejecting head chip, a liquid ejecting head, and a liquid ejecting apparatus.

Background Art

In the related art, as an apparatus that records an image or letters on a recording medium by discharging a droplet-like ink to the recording medium such as a recording sheet, an ink jet printer (liquid ejecting apparatus) including an ink jet head (liquid ejecting head) is provided.

For example, JP7-137245A discloses a configuration in which a piezoelectric ceramic plate, a cover plate, and a manifold member are provided. A plurality of grooves are formed in the piezoelectric ceramic plate. A metal electrode is formed on each of the plurality of grooves. A pattern which is electrically connected to the metal electrode is formed on the surface of the piezoelectric ceramic plate. The pattern is connected to a wiring pattern of a flexible printed circuit board.

However, since the plurality of grooves are formed in the piezoelectric ceramic plate, strength at a connection portion between the pattern of the piezoelectric ceramic plate and the wiring pattern of the flexible printed circuit board may be decreased. In addition, since the pattern is required to be disposed at a position of the piezoelectric ceramic plate at which the grooves are not provided, the degree of freedom of a layout of the pattern may be low and it may be not possible to form a desired pattern.

SUMMARY OF THE INVENTION

To solve the above problems, an object of the present invention is to provide a liquid ejecting head chip, a liquid ejecting head, and a liquid ejecting apparatus in which it is possible to secure strength at a connection portion between various wirings, and to improve the degree of freedom of layouts for the various wirings and form a desired wiring pattern.

According to an aspect of the present invention, a liquid ejecting head chip includes an actuator plate, a cover plate, a common electrode, an individual electrode, and a connection wiring. In the actuator plate, a plurality of ejection channels and a plurality of non-ejection channels which extend in a first direction are alternately arranged at a distance in a second direction which is orthogonal to the first direction. The cover plate is stacked on an actuator plate-side first main surface of the actuator plate in a third direction which is orthogonal to the first direction and the second direction, so as to close the plurality of ejection channels and the plurality of non-ejection channels. The common electrode is formed on an inner surface of each of the ejection channels. The individual electrode is formed on an inner surface of each of the non-ejection channels. The connection wiring is divided so as to be formed in at least 3 or more places in the second direction on the cover plate, and the connection wiring connects the common electrode to an external wiring.

According to this configuration, since the connection wiring is formed in the cover plate, it is possible to secure an area of a region in which the connection wiring can be formed, without being influenced by grooves such as the channels, in comparison to a case where the connection wiring is formed on the actuator plate. Accordingly, it is possible to secure strength at a connection portion between various wirings, and to improve the degree of freedom of layouts for the various wirings and form a desired wiring pattern. In addition, since the connection wiring is formed so as to be divided in the second direction, it is possible to reduce the length of the liquid ejecting head chip in the first direction, in comparison to a case where the connection wiring is formed so as to be divided in the first direction. In addition, since the connection wiring is divided so as to be formed in at least 3 or more places in the second direction, it is possible to avoid an occurrence of inconvenience such as heating which occurs by concentration of a current on the connection wiring, in comparison to a case where the connection wiring is partially formed (for example, at both ends of the cover plate in the second direction). In addition, it is possible to secure an area of a region in which the connection wiring can be formed, without being influenced by grooves such as the ejection channels and the non-ejection channels. In particular, in the configuration in which the ejection channels and the non-ejection channels are formed in the actuator plate, a region of forming the channels easily becomes complicated in comparison to a configuration in which only the ejection channels are formed. Thus, it is preferable that strength at a connection portion between various wirings is secured, the degree of freedom of layouts for the various wirings is improved, and a desired wiring pattern is formed.

In the liquid ejecting head chip, the connection wiring may be formed at a tail portion of the cover plate, which extends out of one end surface of the actuator plate in the first direction, in a stacked state of the actuator plate and the cover plate.

According to this configuration, it is possible to secure a wide area of the region in which the connection wiring can be formed in the tail portion of the cover plate. Accordingly, it is easy to secure strength at a connection portion between various wirings, and to improve the degree of freedom of layouts for the various wirings and form a desired wiring pattern.

In the liquid ejecting head chip, a liquid supply passage which penetrates the cover plate in the third direction and communicates with the ejection channel may be formed in the cover plate. The connection wiring may include an in-liquid-supply-passage electrode and a lead wiring. The in-liquid-supply-passage electrode is formed on an inner surface of the liquid supply passage. The lead wiring is divided so as to be formed in at least 3 or more places in the second direction on the tail portion of the cover plate, and the lead wiring connects the in-liquid-supply-passage electrode to the external wiring.

According to this configuration, it is possible to electrically connect the common electrode to the external wiring via the in-liquid-supply-passage electrode and the lead wiring. Therefore, in comparison to a case where the connection wiring is provided on a surface which is different from the inner surface of the liquid supply passage, it is easy to cause the connection wiring to be disposed at a position which avoids the actuator plate. In addition, since the lead wiring is divided so as to be formed in at least 3 or more places in the second direction, it is possible to suppress an occurrence of dullness of a driving pulse, which occurs by a difference of a nozzle position in the second direction, in comparison to a case where the lead wiring is partially formed (for example, at both ends of the cover plate in the second direction). For example, in comparison to a case where the lead wiring is divided so as to be formed only at both ends of the cover plate in the second direction, it is possible to suppress an occurrence of a large potential difference between both of the ends thereof in the second direction. Accordingly, it is possible to suppress an occurrence of a situation in which it is difficult to generate a desired driving pulse.

In the liquid ejecting head chip, at one end of the tail portion of the cover plate in the first direction, a plurality of recess portions which are recessed toward the other end of the cover plate in the first direction and are disposed to be spaced from each other in the second direction may be formed. The lead wiring may connect the in-liquid-supply-passage electrode to the external wiring through the recess portion.

According to this configuration, in comparison to a case where the lead wiring connects the in-liquid-supply-passage electrode to the external wiring through a through-hole, it is possible to reduce the length of the liquid ejecting head chip in the first direction because it is sufficient that the cover plate has a recess-portion forming region which is smaller than a through-hole forming region.

In the liquid ejecting head chip, a plurality of through-holes which penetrate the cover plate in the third direction and are disposed to be spaced from each other in the second direction may be formed at one end portion of the cover plate in the first direction in the tail portion. The lead wiring may connect the in-liquid-supply-passage electrode to the external wiring through the through-hole.

According to this configuration, in comparison to a case where the lead wiring connects the in-liquid-supply-passage electrode to the external wiring through the recess portion, it is possible to protect the lead wiring by a through-hole forming portion (wall portion). Accordingly, it is possible to avoid an occurrence of a situation in which the lead wiring in the through-hole is damaged.

In the liquid ejecting head chip, the liquid supply passage may include a plurality of slits which are opened in a cover plate-side first main surface of the cover plate, which faces the actuator plate-side first main surface, so as to communicate with the ejection channels and which are disposed to be spaced from each other in the second direction. A plurality of actuator plate-side common pads which extend from the common electrodes and are disposed to be spaced from each other in the second direction may be formed at a portion of the actuator plate-side first main surface, which is positioned on one side of the ejection channel in the first direction. A plurality of cover plate-side common pads which extend from the in-liquid-supply-passage electrode, are disposed to be spaced from each other in the second direction, and respectively face the actuator plate-side common pads in the third direction may be formed around the slits in the cover plate-side first main surface.

According to this configuration, when the actuator plate and the cover plate are bonded to each other, the actuator plate-side common pad can be connected to the cover plate-side common pad. Thus, it is possible to easily connect the common electrode to the external wiring via the pads and the like. In addition, the common electrode formed on the inner surface of each of the plurality of ejection channels is shared by the in-liquid-supply-passage electrode through an individual slit with passing from the actuator plate-side common pad through the cover plate-side common pad, and the lead wiring connected to the in-liquid-supply-passage electrode extends up to the tail portion of the cover plate. Thus, it is possible to easily perform electrode arrangement of the common electrode and the individual electrode.

In the liquid ejecting head chip, a transverse common electrode which is connected to the plurality of cover plate-side common pads and extends in the second direction may be formed on the cover plate-side first main surface.

According to this configuration, it is possible to preliminarily connect the plurality of cover plate-side common pads to each other by the transverse common electrode. Thus, in comparison to a case where the plurality of cover plate-side common pads are connected only to the in-liquid-supply-passage electrode, it is possible to improve reliability of electric connection between the plurality of cover plate-side common pads.

In the liquid ejecting head chip, an electrode clearance groove which extends in the second direction and faces the transverse common electrode in the third direction may be formed at a portion of the actuator plate-side first main surface, which is positioned on one side of the ejection channel in the first direction.

According to this configuration, when the actuator plate and the cover plate are bonded to each other, the transverse common electrode can be accommodated in the electrode clearance groove. Thus, it is possible to avoid an occurrence of short circuit between the electrode on the actuator plate side (for example, individual electrode), and the transverse common electrode.

In the liquid ejecting head chip, the lead wiring may include a common terminal which is divided so as to be formed in at least 3 or more places in the second direction, on a cover plate-side first main surface facing the actuator plate-side first main surface at the tail portion of the cover plate, and which is connected to the external wiring.

According to this configuration, since the common terminal is formed on the cover plate-side first main surface at the tail portion of the cover plate, it is possible to easily perform crimping work between the external wiring and the common terminal, in comparison to a case where the common terminal is formed on the cover plate-side second main surface. In addition, since the common terminal is divided so as to be formed in at least 3 or more places in the second direction, it is possible to suppress an occurrence of dullness of a driving pulse, which occurs by a difference of a nozzle position in the second direction, in comparison to a case where the common terminal is partially formed (for example, at both ends of the cover plate in the second direction).

In the liquid ejecting head chip, on the actuator plate-side first main surface, an actuator plate-side individual wiring which extends in the second direction at one end portion thereof in the first direction, and connects individual electrodes which face each other with the ejection channel interposed between the individual electrodes to each other may be formed. In the cover plate, a cover plate-side individual wiring which is divided in the second direction at the one end portion thereof in the first direction may be formed on the cover plate-side first main surface which faces the actuator plate-side first main surface. The cover plate-side individual wiring may include a cover plate-side individual pad which faces the actuator plate-side individual wiring in the third direction, and an individual terminal which extends from the cover plate-side individual pad toward one end in the first direction.

According to this configuration, when the actuator plate and the cover plate are bonded to each other, the actuator plate-side individual wiring can be connected to the cover plate-side individual pad. Thus, it is possible to easily connect the individual electrode to the external wiring via the individual wiring, the individual pad, and the like.

According to another aspect of the present invention, a liquid ejecting head includes the liquid ejecting head chip.

According to this configuration, in the liquid ejecting head which includes the liquid ejecting head chip, it is possible to secure strength at a connection portion between various wirings, and to improve the degree of freedom of layouts for the various wirings and form a desired wiring pattern. In addition, it is possible to reduce the length of the liquid ejecting head in the first direction. In addition, it is possible to avoid an occurrence of inconvenience such as heating which occurs by concentration of a current on the connection wiring. It is preferable that strength at a connection portion between various wirings is secured, the degree of freedom of layouts for the various wirings is improved, and a desired wiring pattern is formed.

The liquid ejecting head may include a pair of liquid ejecting head chips which are disposed such that a cover plate-side second main surface on a side of one cover plate, which is opposite to the cover plate-side first main surface which faces the actuator plate-side first main surface faces a cover plate-side second main surface on the side of the other cover plate, in the third direction. A liquid supply passage which penetrates the cover plate in the third direction and communicates with the ejection channel may be formed in the cover plate. A flow passage plate may be disposed between the pair of liquid ejecting head chips. An inlet flow passage which communicates with liquid supply passages of the pair of the cover plates may be formed in the flow passage plate.

According to this configuration, in each of the liquid ejecting head chips, the cover plate-side first main surface can be exposed to the outside thereof in the third direction. Thus, it is possible to easily connect the external wiring to the connection wiring in a two-row type liquid ejecting head.

In the liquid ejecting head, wherein each of the plurality of ejection channels may be opened in the other end surface of the actuator plate in each of the pair of liquid ejecting head chips in the first direction. An ejection plate which has ejection holes which respectively communicate with the ejection channels may be disposed on the other end side of each of the pair of actuator plates in the first direction. A return plate which has circulation passages which cause the ejection channels to respectively communicate with the ejection holes may be disposed between the pair of actuator plates and the ejection plate in the first direction. An outlet flow passage which communicates with the circulation passage may be formed in the flow passage plate.

According to this configuration, it is possible to circulate a liquid between each of the ejection channels and a liquid tank. Thus, it is possible to suppress staying of bubbles near the ejection hole in the ejection channel.

According to another aspect of the present invention, a liquid ejecting apparatus includes the liquid ejecting head and a moving mechanism. The moving mechanism relatively moves the liquid ejecting head and a recording medium.

According to this configuration, in the liquid ejecting apparatus which includes the liquid ejecting head, it is possible to secure strength at a connection portion between various wirings, and to improve the degree of freedom of layouts for the various wirings and form a desired wiring pattern. In addition, it is possible to reduce the length of the liquid ejecting head in the first direction. In addition, it is possible to avoid an occurrence of inconvenience such as heating which occurs by concentration of a current on the connection wiring. It is preferable that strength at a connection portion between various wirings is secured, the degree of freedom of layouts for the various wirings is improved, and a desired wiring pattern is formed.

According to the present invention, it is possible to provide a liquid ejecting head chip, a liquid ejecting head, and a liquid ejecting apparatus in which it is possible to secure strength at a connection portion between various wirings, and to improve the degree of freedom of layouts for the various wirings and form a desired wiring pattern.

DETAILED DESCRIPTION OF THE INVENTION

Figure 1:
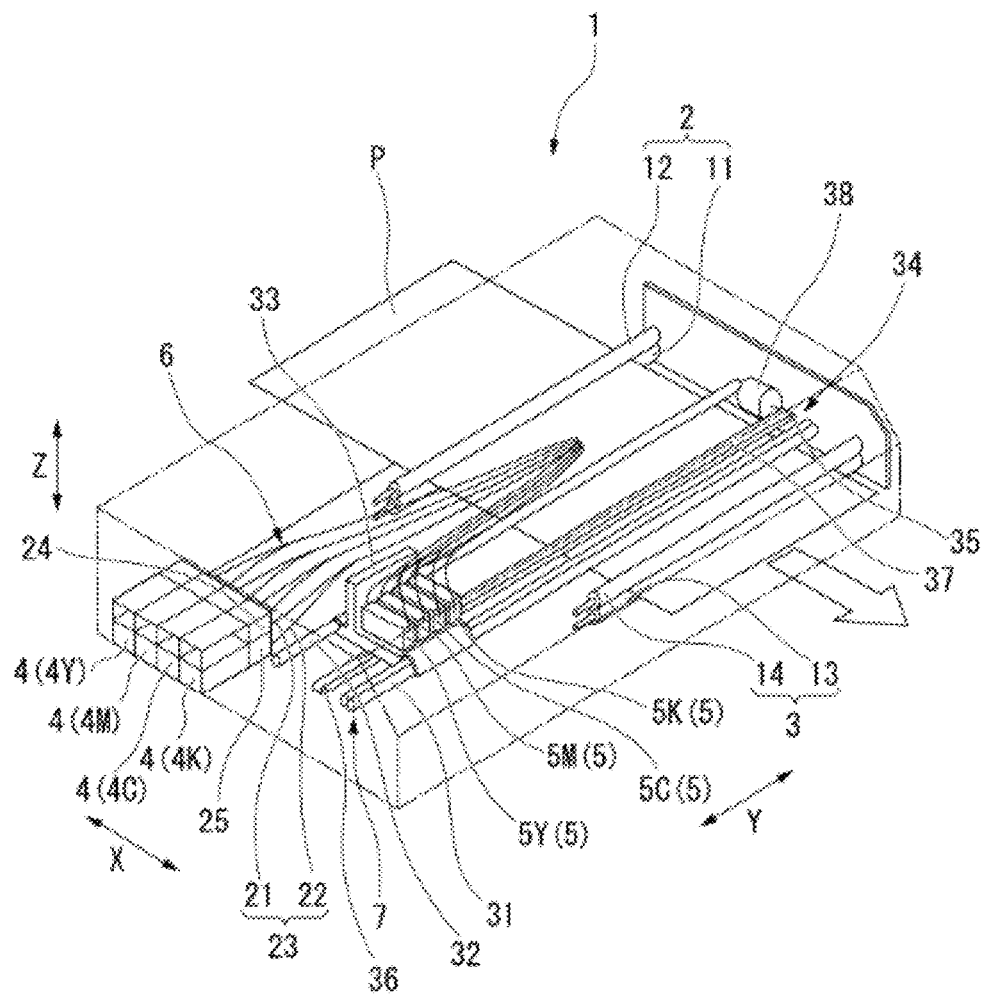
FIG. 1 is a schematic configuration diagram illustrating an ink jet printer according to an embodiment.

Hereinafter, an embodiment according to the present invention will be described with reference to the drawings. In the embodiment, as an example of a liquid ejecting apparatus which includes a liquid ejecting head including a liquid ejecting head chip (simply referred to as "a head chip" below) according to the present invention, an ink jet printer (simply referred to as "a printer" below) that performs recording on a recording medium by using an ink (liquid) will be described. In the drawings used in the following descriptions, members are assumed to have a size which allows recognition of each of the members. Thus, the scale of each of the members is appropriately changed.

Printer

FIG. 1 is a schematic configuration diagram illustrating a printer 1.

As illustrated in FIG. 1, the printer 1 in the embodiment includes a pair of transporting means 2 and 3, an ink tank 4, an ink jet head (liquid ejecting head) 5, ink circulation means 6, and scanning means 7. In the following descriptions, descriptions will be made, if necessary, by using an orthogonal coordinates system of X, Y, and Z. An X-direction is a transport direction of a recording medium P (for example, paper). A Y-direction is a scanning direction of the scanning means 7. A Z-direction is a vertical direction which is orthogonal to the X-direction and the Y-direction.

The transporting means 2 and 3 transport the recording medium P in the X-direction. Specifically, the transporting means 2 includes a grit roller 11, a pinch roller 12, and a driving mechanism (not illustrated) such as a motor. The grit roller 11 is provided to extend in the Y-direction. The pinch roller 12 is provided to extend in parallel to the grit roller 11. The driving mechanism rotates the shaft of the grit roller 11. The transporting means 3 includes a grit roller 13, a pinch roller 14, and a driving mechanism (not illustrated). The grit roller 13 is provided to extend in the Y-direction. The pinch roller 14 is provided to extend in parallel to the grit roller 13. The driving mechanism (not illustrated) rotates the shaft of the grit roller 13.

A plurality of ink tanks 4 are provided to be arranged in one direction. In the embodiment, the plurality of ink tanks 4 respectively correspond to ink tanks 4Y, 4M, 4C, and 4K that accommodate inks of four colors which are yellow, magenta, cyan, and black. In the embodiment, the ink tanks 4Y, 4M, 4C, and 4K are disposed side by side in the X-direction.

Figure 2:
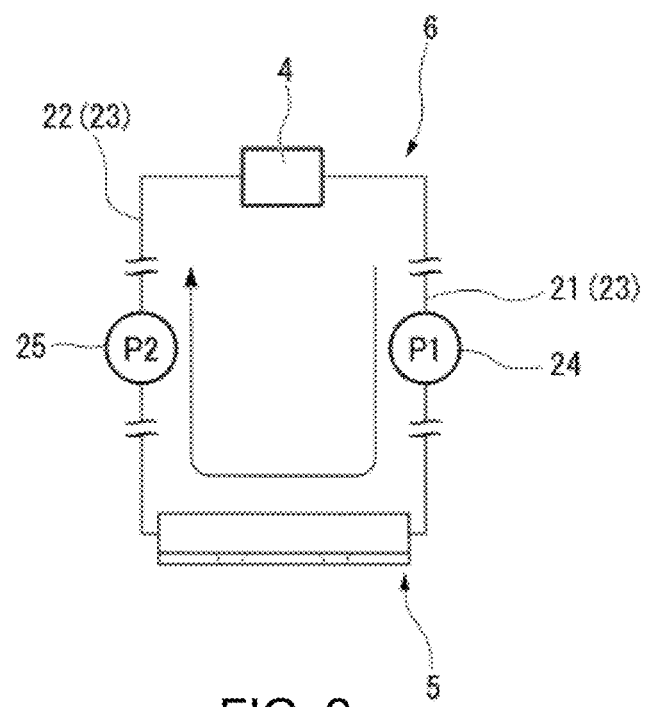
FIG. 2 is a schematic configuration diagram illustrating an ink jet head and ink circulation means in the embodiment.

As illustrated in FIG. 2, the ink circulation means 6 is configured to circulate an ink between the ink tank 4 and the ink jet head 5. Specifically, the ink circulation means 6 includes a circulation flow passage 23, a pressure pump 24, and a suction pump 25. The circulation flow passage 23 includes an ink supply tube 21 and an ink discharge tube 22. The pressure pump 24 is connected to the ink supply tube 21. The suction pump 25 is connected to the ink discharge tube 22. For example, the ink supply tube 21 and the ink discharge tube 22 are configured by a flexible hose which has flexibility and can follow an operation of the scanning means 7 for supporting the ink jet head 5.

The pressure pump 24 applies pressure to the inside of the ink supply tube 21, and thus an ink is sent to the ink jet head 5 through the ink supply tube 21. Thus, the ink supply tube 21 side has positive pressure in comparison to the ink jet head 5.

The suction pump 25 depressurizes the ink discharge tube 22, and thus suctions an ink from the ink jet head 5 through the ink discharge tube 22. Thus, the ink discharge tube 22 side has negative pressure in comparison to the ink jet head 5. The ink may be circulated between the ink jet head 5 and the ink tank 4 through the circulation flow passage 23, by driving of the pressure pump 24 and the suction pump 25.

As illustrated in FIG. 1, the scanning means 7 causes the ink jet head 5 to perform scanning with reciprocating, in the Y-direction. Specifically, the scanning means 7 includes a pair of guide rails 31 and 32, a carriage 33, and a driving mechanism 34. The guide rails 31 and 32 are provided to extend in the Y-direction. The carriage 33 is supported so as to be able to move on the pair of the guide rails 31 and 32. The driving mechanism 34 moves the carriage 33 in the Y-direction. The transporting means 2 and 3, and the scanning means 7 function as a moving mechanism that relatively moves the ink jet head 5 and the recording medium P.

The driving mechanism 34 is disposed between the guide rails 31 and 32 in the X-direction. The driving mechanism 34 includes a pair of pulleys 35 and 36, an endless belt 37, and a driving motor 38. The pair of pulleys 35 and 36 is arranged at a distance in the Y-direction. The endless belt 37 is wound around the pair of pulleys 35 and 36. The driving motor 38 rotates and drives one pulley 35.

The carriage 33 is linked to the endless belt 37. A plurality of ink jet heads 5 are mounted in the carriage 33. In the embodiment, the plurality of ink jet heads 5 respectively correspond to ink jet heads 5Y, 5M, 5C, and 5K that discharge inks of four colors which are yellow, magenta, cyan, and black. In the embodiment, the ink jet heads 5Y, 5M, 5C, and 5K are disposed side by side in the Y-direction.

Ink Jet Head

Figure 3:
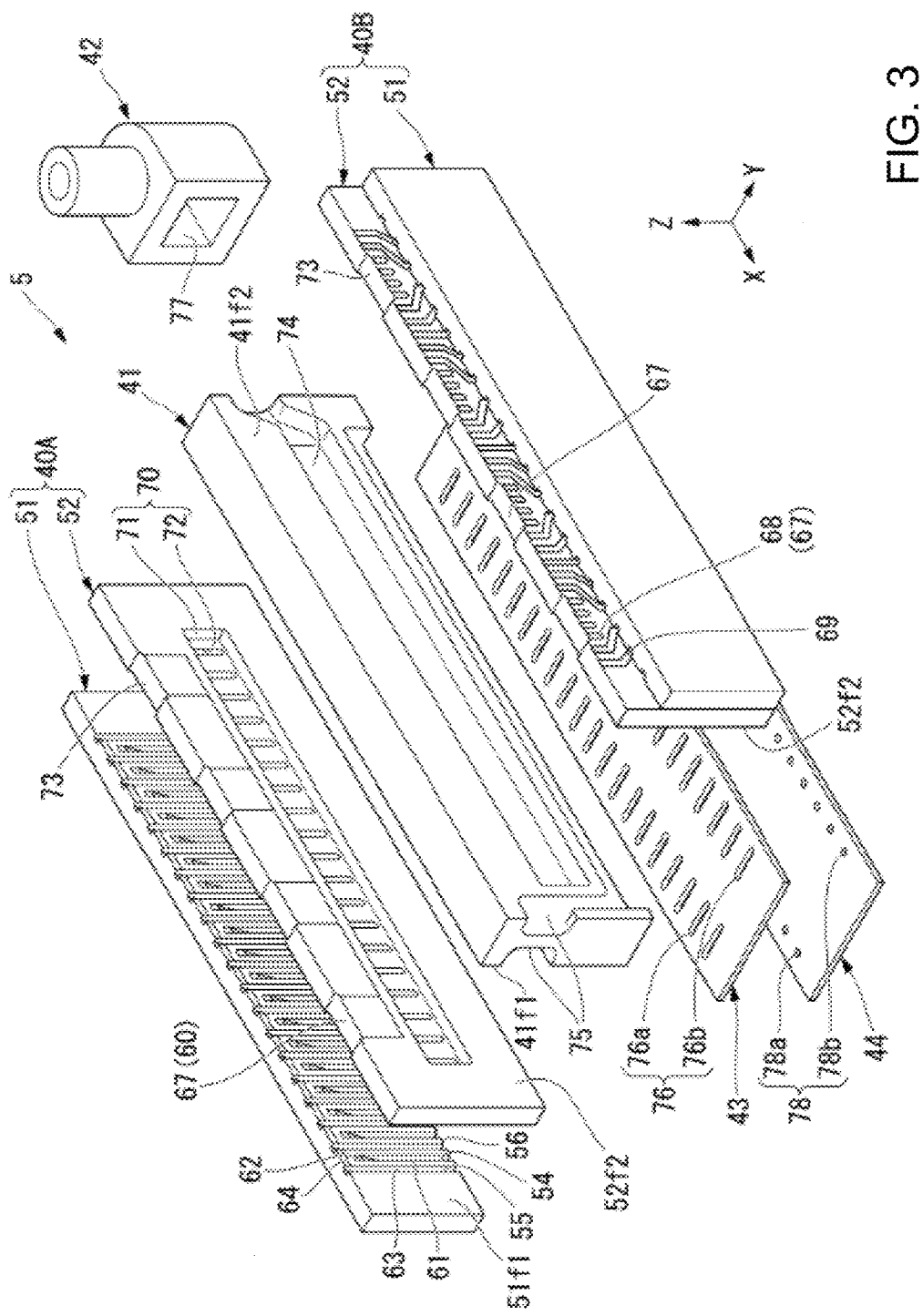
FIG. 3 is an exploded perspective view illustrating the ink jet head in the embodiment.

As illustrated in FIG. 3, the ink jet head 5 includes a pair of head chips 40A and 40B, a flow passage plate 41, an inlet manifold 42, an outlet manifold (not illustrated), a return plate 43, and a nozzle plate (ejection plate) 44. As the ink jet head 5, a circulation type (edge shoot circulation type) of circulating an ink between the ink jet head 5 and the ink tank 4, in a so-called edge shoot type of discharging an ink from the tip end portion of the discharge channel 54 in a channel extension direction is provided.

Head Chip

A pair of head chips 40A and 40B are a first head chip 40A and a second head chip 40B. Descriptions will be made below focusing on the first head chip 40A. In the second head chip 40B, component which are the same as those of the first head chip 40A are denoted by the same reference signs, and detailed descriptions thereof will not be repeated.

The first head chip 40A includes an actuator plate 51 and a cover plate 52.

Actuator Plate

The appearance of the actuator plate 51 is a rectangular plate shape which is long in the X-direction and is short in the Z-direction. In the embodiment, the actuator plate 51 is a so-called Chevron type stacked substrate in which two piezoelectric substrates having polarization directions which are different from each other in a thickness direction (Y-direction) are stacked (see FIG. 6). For example, a ceramics substrate formed of PZT (lead titanate zirconate) or the like is suitably used as the piezoelectric substrate.

A plurality of channels 54 and 55 are formed in a first main surface (actuator plate-side first main surface) of the actuator plate 51 in the Y-direction. In the embodiment, the actuator plate-side first main surface refers to an inner side surface 51/1 of the actuator plate 51 in the Y-direction (referred to as "an AP-side-Y-direction inner side surface 51/1" below). Here, the inner side in the Y-direction means the center side of the ink jet head 5 in the Y-direction (the flow passage plate 41 side in the Y-direction). In the embodiment, an actuator plate-side second main surface is an outer side surface of the actuator plate 51 in the Y-direction (indicated by the reference sign of 51/2 in the drawings).

Each of the channels 54 and 55 is formed to have a straight-line shape which extends in the Z-direction (first direction). The channels 54 and 55 are alternately formed to be spaced from each other in the X-direction (second direction). The channels 54 and 55 are defined from each other by a drive wall 56 formed by the actuator plate 51. One channel 54 is a discharge channel (ejection channel) 54 with which an ink is filled. The other channel 55 is a non-discharge channel (non-ejection channel) 55 with which an ink is not filled.

An upper end portion of the discharge channel 54 is terminated in the actuator plate 51. A lower end portion of the discharge channel 54 is opened in a lower end surface of the actuator plate 51.

Figure 4:
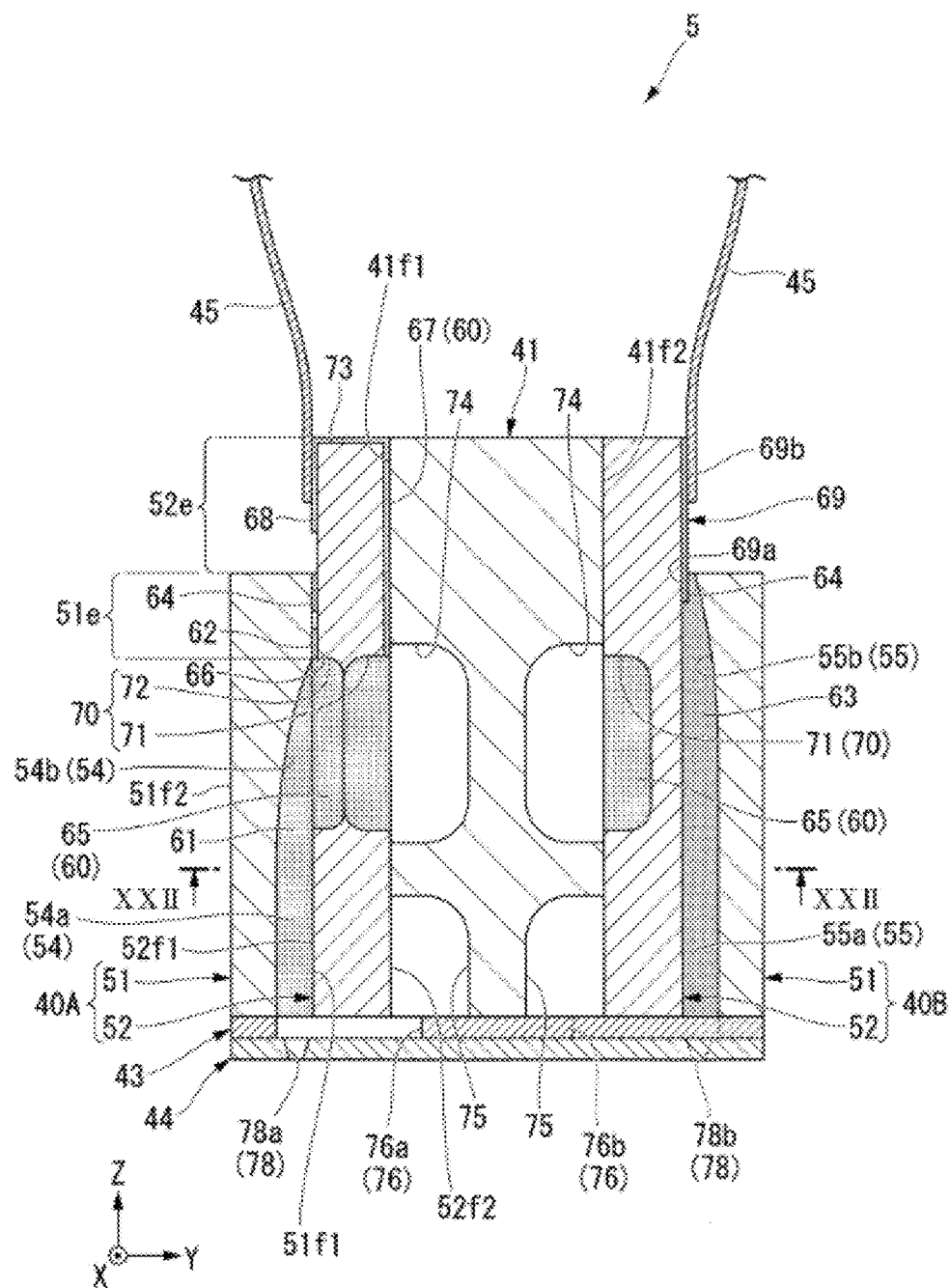
FIG. 4 is a sectional view illustrating the ink jet head in the embodiment.

FIG. 4 is a diagram illustrating a section of the discharge channel 54 in the first head chip 40A.

As illustrated in FIG. 4, the discharge channel 54 includes an extension portion 54a positioned at the lower end portion of the discharge channel 54, and a raise-and-cut portion 54b which continues upward from the extension portion 54a.

The extension portion 54a has a groove depth which is constant over the entirety thereof in the Z-direction. The raise-and-cut portion 54b has a groove depth which gradually becomes shallow while being raised upwardly.

As illustrated in FIG. 3, an upper end portion of the non-discharge channel 55 is opened in the upper end surface of the actuator plate 51. A lower end portion of the non-discharge channel 55 is opened in the lower end surface of the actuator plate 51.

Figure 5:
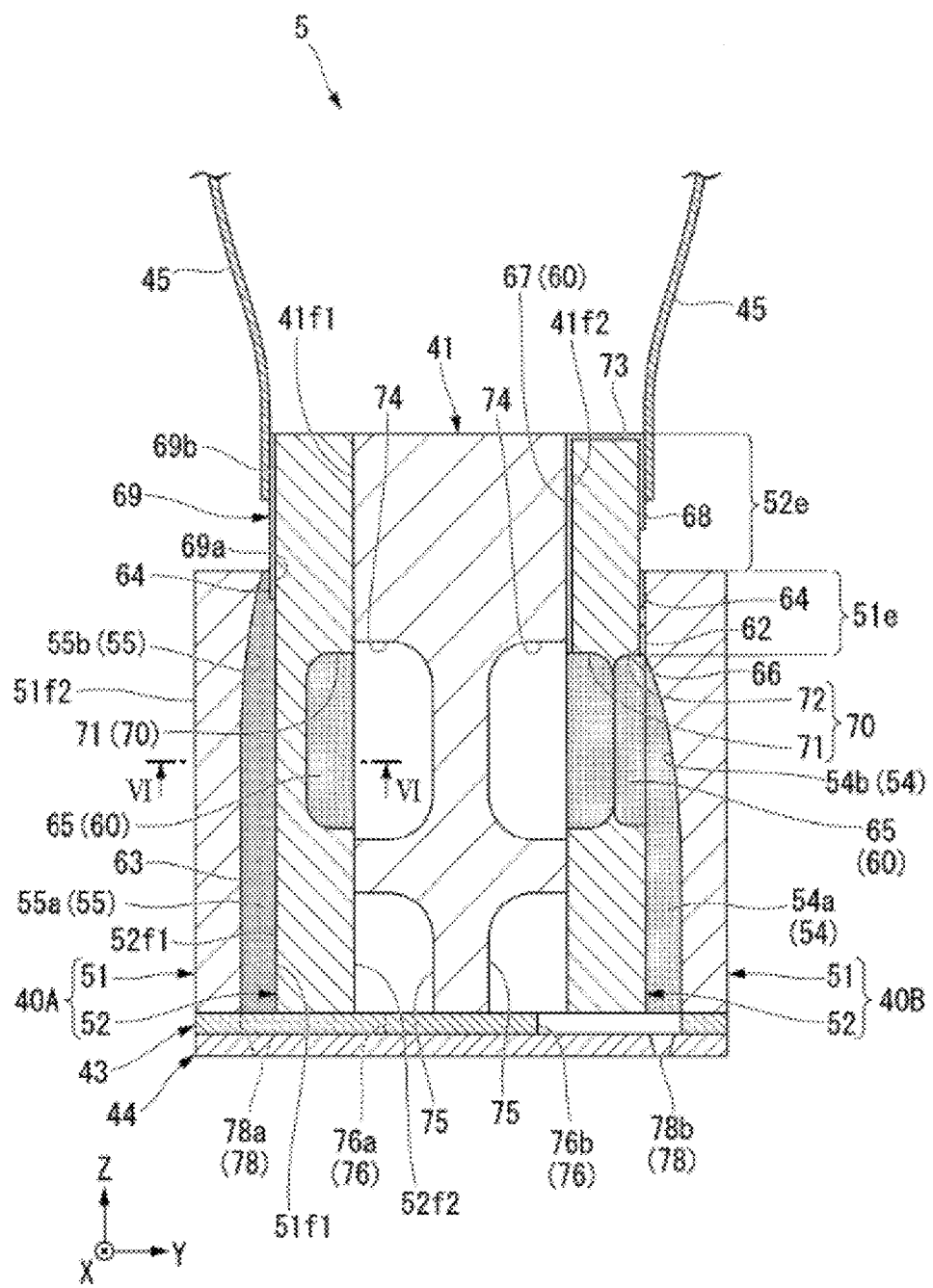
FIG. 5 is a sectional view illustrating the ink jet head in the embodiment.

FIG. 5 is a diagram illustrating a section of the non-discharge channel 55 in the first head chip 40A.

As illustrated in FIG. 5, the non-discharge channel 55 includes an extension portion 55a positioned at a lower end portion of the non-discharge channel 55, and a raise-and-cut portion 55b which continues upward from the extension portion 55a.

The extension portion 55a has a groove depth which is constant over the entirety thereof in the Z-direction. The length of the extension portion 55a in the non-discharge channel 55 in the Z-direction is longer than the length of the extension portion 54a (see FIG. 4) in the discharge channel 54 in the Z-direction. The raise-and-cut portion 55b has a groove depth which gradually becomes shallow while being raised upwardly. The slope of the raise-and-cut portion 55b in the non-discharge channel 55 is substantially the same as the slope of the raise-and-cut portion 54b (see FIG. 4) in the discharge channel 54. That is, in the discharge channel 54 and the non-discharge channel 55, a slope start position is different by a difference of the length in the Z-direction between the extension portions 54a and 55a, but the slope itself (gradient, curvature) is substantially the same as each other.

As illustrated in FIG. 4, a common electrode 61 is formed on an inner surface of the discharge channel 54. The common electrode 61 is formed on the entirety of the inner surface of the discharge channel 54. That is, the common electrode 61 is formed on the entirety of the inner surface of the extension portion 54a and on the entirety of the inner surface of the raise-and-cut portion 54b.

An actuator plate-side common pad 62 (referred to as "an AP-side common pad 62" below) is formed on an inner side surface of a portion 51e (referred to as "an AP-side tail portion 51e" below) of the actuator plate 51, which is positioned over the discharge channel 54, in the Y-direction. The AP-side common pad 62 is formed to extend from an upper end of the common electrode 61 to an inner side surface of the AP-side tail portion 51e in the Y-direction. That is, the lower end portion of the AP-side common pad 62 is connected to the common electrode 61 in the discharge channel 54. The upper end portion of the AP-side common pad 62 is terminated on the inner side surface of the AP-side tail portion 51e in the Y-direction. The AP-side common pad 62 is connected to the common electrode 61. As illustrated in FIG. 3, a plurality of AP-side common pads 62 are disposed to be spaced from each other in the X-direction, on the inner side surface of the AP-side tail portion 51e (see FIG. 7) in the Y-direction.

Figure 6:
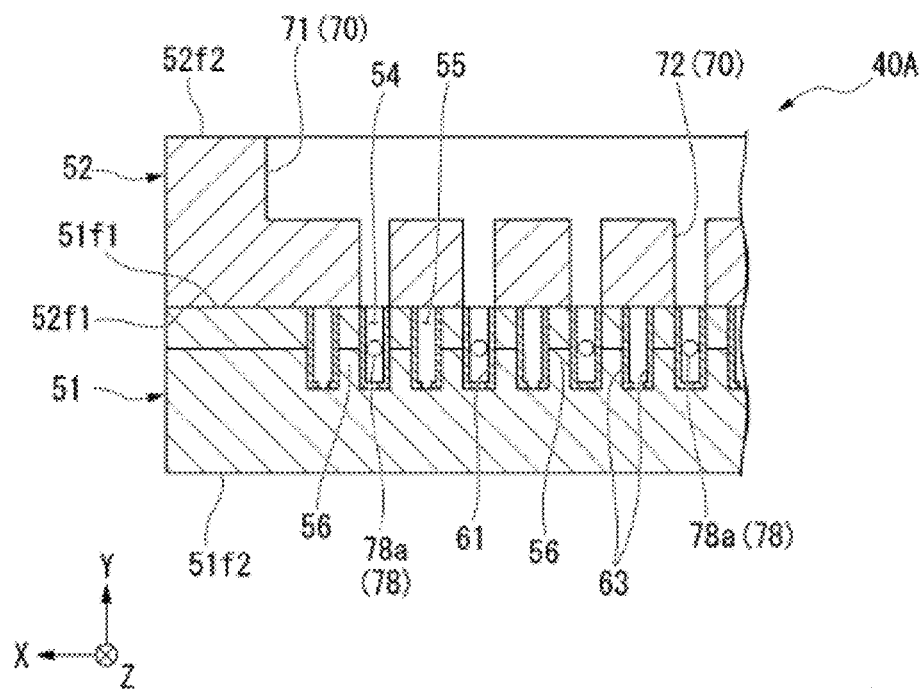
FIG. 6 is a view illustrating a section taken along VI-VI in FIG. 5.

As illustrated in FIG. 5, an individual electrode 63 is formed on an inner surface of the non-discharge channel 55. As illustrated in FIG. 6, individual electrodes 63 are respectively formed on inner side surfaces which face each other in the X-direction, in the inner surface of the non-discharge channel 55. Thus, among individual electrodes 63, individual electrodes 63 which face each other in the same non-discharge channel 55 are electrically isolated on the bottom surface of the non-discharge channel 55. The individual electrode 63 is formed over the entirety (entirety in the Y-direction and the Z-direction) of the inner side surface of the non-discharge channel 55.

As illustrated in FIG. 5, an actuator plate-side individual wiring 64 (referred to as "an AP-side individual wiring 64" below) is formed on the inner side surface of the AP-side tail portion 51e in the Y-direction. As illustrated in FIG. 3, regarding the AP-side individual wiring 64, a portion of on the inner side surface of the AP-side tail portion 51e (see FIG. 7) in the Y-direction, which is positioned over the AP-side common pad 62 extends in the X-direction. The AP-side individual wiring 64 connects individual electrodes 63 which face each other with the discharge channel 54 interposed between the individual electrodes 63 to each other.

Cover Plate

As illustrated in FIG. 3, the appearance of the cover plate 52 is a rectangular plate shape which is long in the X-direction and is short in the Z-direction. The length of the cover plate 52 in a longer side direction is substantially equal to the length of the actuator plate 51 in the longer side direction. The length of the cover plate 52 in a shorter side direction is longer than the length of the actuator plate 51 in the shorter side direction. A first main surface (cover plate-side first main surface) of the cover plate 52, which faces the AP-side-Y-direction inner side surface 51/1 is bonded to the AP-side-Y-direction inner side surface 51/1. In the embodiment, the cover plate-side first main surface refers to an outer side surface 52/1 of the cover plate 52 in the Y-direction (referred to as "a CP-side-Y-direction outer side surface 52/1" below). Here, the outer side in the Y-direction means an opposite side of the center side of the ink jet head 5 in the Y-direction (opposite side of the flow passage plate 41 side in the Y-direction). In the embodiment, a cover plate-side second main surface refers to an inner side surface 52/2 of the cover plate 52 in the Y-direction (referred to as "a CP-side-Y-direction inner side surface 52f2" below).

A liquid supply passage 70 is formed in the cover plate 52. The liquid supply passage 70 penetrates the cover plate 52 in the Y-direction (third direction) and communicates with the discharge channel 54. The liquid supply passage 70 includes a common ink room 71 and a plurality of slits 72. The common ink room 71 is formed in a manner that the inner side of the cover plate 52 is opened in the Y-direction. The plurality of slits 72 communicate with the common ink room 71. The slits 72 are opened in the outer side of the cover plate 52 in the Y-direction and are disposed to be spaced from each other in the X-direction. The common ink room 71 individually communicates with the discharge channels 54 through the slit 72, respectively. The common ink room 71 does not communicate with the non-discharge channel 55.

As illustrated in FIG. 4, the common ink room 71 is formed in the CP-side-Y-direction inner side surface 52f2. The common ink room 71 is disposed at a position which is substantially the same as that of the raise-and-cut portion 54b of the discharge channel 54, in the Z-direction. The common ink room 71 is formed to have a groove shape which is recessed toward the CP-side-Y-direction outer side surface 52f1 side and extends in the X-direction. An ink flows into the common ink room 71 through the flow passage plate 41.

The slits 72 are formed in the CP-side-Y-direction outer side surface 52f1. The slits 72 are disposed at positions which face the common ink room 71 in the Y-direction. The slit 72 communicates with the common ink room 71 and the discharge channel 54. The width of the slit 72 in the X-direction is substantially equal to the width of the discharge channel 54 in the X-direction.

In the cover plate 52, a common electrode 65 (referred to as "an in-liquid-supply-passage electrode 65" below) is formed on the inner surface of the liquid supply passage 70. That is, the in-liquid-supply-passage electrode 65 is formed in the entirety of the common ink room 71 and in the entirety of the slit 72.

Figure 7:
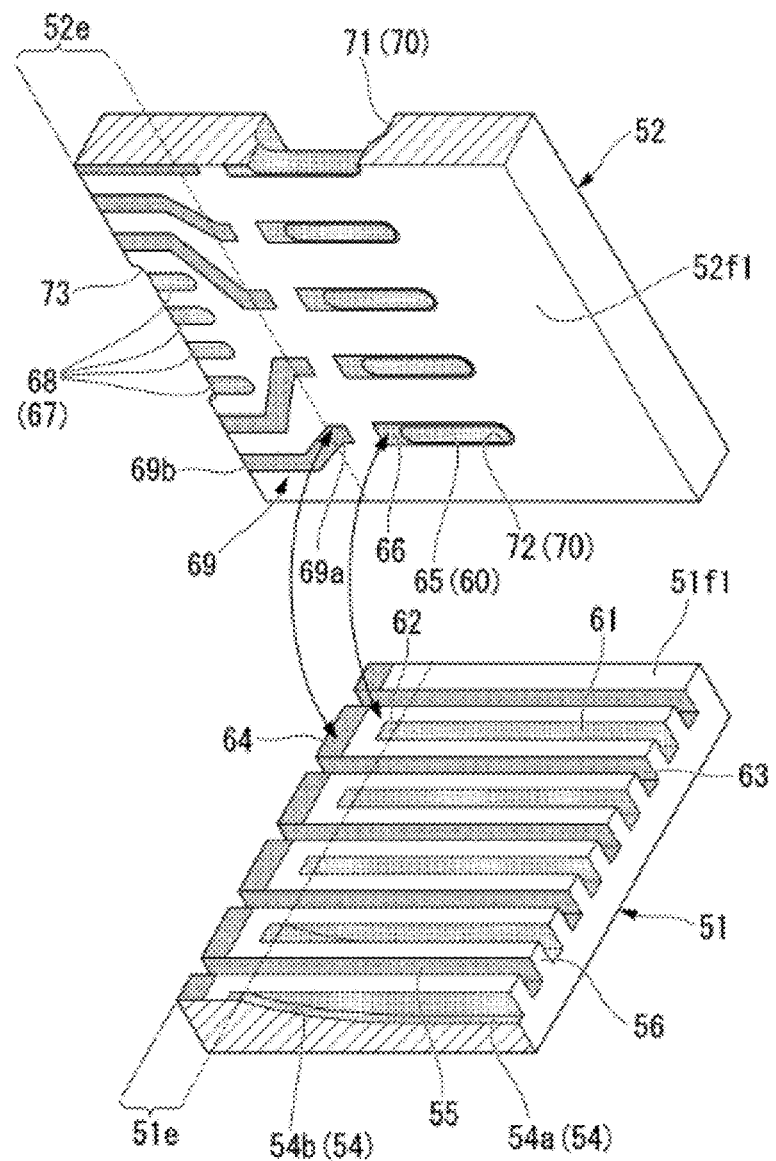
FIG. 7 is an exploded perspective view illustrating a head chip in the embodiment.
Figure 8:
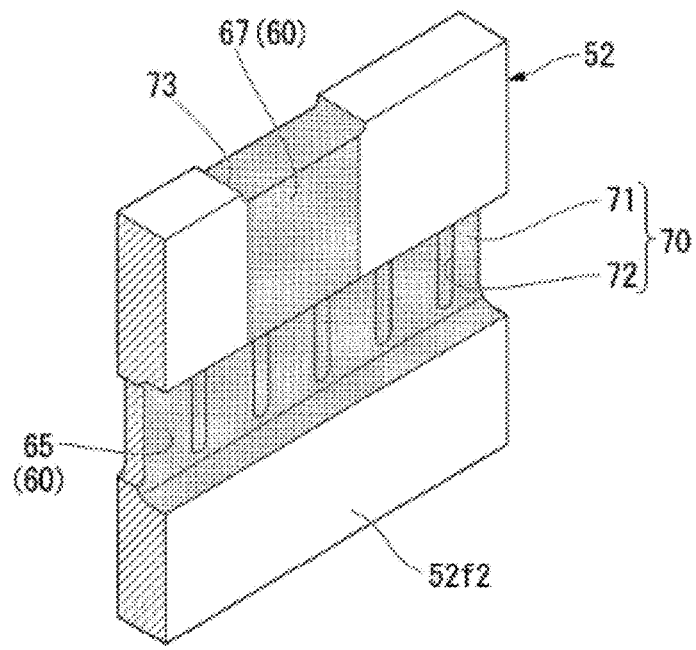
FIG. 8 is a perspective view illustrating a cover plate in the embodiment.

As illustrated in FIG. 7, a common pad 66 on the cover plate side (referred to as "a CP-side common pad 66" below) is formed around the slit 72 in the CP-side-Y-direction outer side surface 52f1. As illustrated in FIG. 4, the CP-side common pad 66 is formed to extend from the upper end of the in-liquid-supply-passage electrode 65 toward an upper part of the CP-side-Y-direction outer side surface 52f1. That is, the lower end portion of the CP-side common pad 66 is connected to the in-liquid-supply-passage electrode 65 in the slit 72. The upper end portion of the CP-side common pad 66 is terminated on the CP-side-Y-direction outer side surface 52f1. The CP-side common pad 66 is continued to the in-liquid-supply-passage electrode 65. A plurality of CP-side common pads 66 are disposed to be spaced from each other on the CP-side-Y-direction outer side surface 52f1 in the X-direction (see FIG. 7).

The CP-side common pad 66 faces the AP-side common pad 62 in the Y-direction. As illustrated in FIG. 7, the CP-side common pad 66 is disposed at a position corresponding to the AP-side common pad 62 when the actuator plate 51 and the cover plate 52 are bonded to each other. That is, when the actuator plate 51 and the cover plate 52 are bonded to each other, the CP-side common pad 66 and the AP-side common pad 62 are electrically connected to each other.

As illustrated in FIG. 4, a common lead wiring 67 is formed around the common ink room 71 in the CP-side-Y-direction inner side surface 52f2. As illustrated in FIG. 3, a plurality of recess portions 73 are formed at the upper end of the cover plate 52. The recess portions 73 are recessed to the inner side of the cover plate 52 in the Z-direction, and are disposed to be spaced from each other in the X-direction. FIG. 3 illustrates four recess portions 73 which are arranged at a substantially equal interval in the X-direction.

As illustrated in FIG. 4, the common lead wiring 67 extends upwardly on the CP-side-Y-direction inner side surface 52f2 from the upper end of the common ink room 71 along the CP-side-Y-direction inner side surface 52f2. Then, the common lead wiring 67 is drawn up to the upper end portion of the CP-side-Y-direction outer side surface 52f1 along the recess portion 73 at the upper end of the cover plate 52. In other words, the common lead wiring 67 is drawn up to the outer side surface of a portion 52e (referred to as "a CP-side tail portion 52e" below) of the cover plate 52, which is positioned over the actuator plate 51, in the Y-direction. Thus, the common electrode 61 formed on the inner surface of each of the plurality of discharge channels 54 is electrically connected to a flexible substrate (external wiring) 45 in the common terminal 68, through the AP-side common pad 62, the CP-side common pad 66, the in-liquid-supply-passage electrode 65, and the common lead wiring 67. In the embodiment, the common lead wiring 67 and the in-liquid-supply-passage electrode 65 constitute a connection wiring 60 which connects the common electrode 61 and the flexible substrate 45 to each other. In the connection wiring 60, the common lead wiring 67 is divided so as to be formed in at least 3 or more places in the X-direction on the cover plate 52.

As illustrated in FIG. 7, the common lead wiring 67 includes a common terminal 68 which is divided so as to be formed in at least 3 or more places in the X-direction, on the outer side surface of the CP-side tail portion 52e in the Y-direction. In the embodiment, 4 common terminals 68 are arranged to be spaced from each other in the X-direction, on the outer side surface of the CP-side tail portion 52e in the Y-direction. The distance between two common terminals 68 which are adjacent to each other is substantially equal.

A cover plate-side individual wiring 69 (referred to as "a CP-side individual wiring 69" below) is formed in the cover plate 52. The CP-side individual wiring 69 is formed so as to be divided in the X-direction, at the upper end portion of the CP-side-Y-direction outer side surface 52f1. The CP-side individual wiring 69 includes a cover plate-side individual pad 69a (referred to as "a CP-side individual pad 69a" below) and an individual terminal 69b. The CP-side individual pad 69a is disposed at a position corresponding to the AP-side individual wiring 64 when the actuator plate 51 and the cover plate 52 are bonded to each other. The individual terminal 69b is formed in a manner that the individual terminal 69b is inclined to be positioned outwardly in the X-direction as coming to the upper side from the CP-side individual pad 69a, and then the individual terminal 69b extends to have a straight-line shape.

That is, when the actuator plate 51 and the cover plate 52 are bonded to each other, the CP-side individual pad 69a and the AP-side individual wiring 64 are electrically connected to each other. A plurality of CP-side individual pads 69a are arranged at a distance in the X-direction. The distance (array pitch) between two CP-side individual pads 69a which are adjacent to each other is substantially constant. The plurality of CP-side individual pads 69a and a plurality of CP-side common pads 66 face each other one by one in the Z-direction. In other words, each of the CP-side individual pads 69a and each of the CP-side common pads 66 are disposed to be aligned on a straight line in the Z-direction.

The individual terminal 69b extends to the upper end of the CP-side tail portion 52e on the outer side surface thereof in the Y-direction. Thus, the individual electrode 63 formed in the inner surface of each of the non-discharge channels 55 is electrically connected to the flexible substrate 45 (see FIG. 5) on the individual terminal 69b, through the AP-side individual wiring 64 and the CP-side individual pad 69a.

A plurality of individual terminals 69b are arranged to be spaced from each other in the X-direction. The distance (array pitch) between two individual terminals 69b which are adjacent to each other is substantially constant. The plurality of individual terminals 69b are arranged between the plurality of common terminals 68 (common terminal groups) which are arranged in the X-direction. The array pitch between the individual terminals 69b and the array pitch between the common terminals 68 are substantially equal to each other.

The cover plate 52 is formed of a material which has insulating properties, and has thermal conductivity which is equal to or greater than that of the actuator plate 51. For example, in a case where the actuator plate 51 is formed of PZT, the cover plate 52 is preferably formed of PZT or silicon. Thus, it is possible to reduce temperature variation in the actuator plate 51 and to cause the temperature of an ink to be uniform. Thus, it is possible to cause a discharge speed of an ink to be uniform and to improve printing stability.

Arrangement Relationship of Pair of Head Chips

As illustrated in FIG. 3, the head chips 40A and 40B are arranged to be spaced from each other in the Y-direction, in a state where CP-side-Y-direction inner side surfaces 52f2 face each other in the Y-direction.

The discharge channel 54 and the non-discharge channel 55 of the second head chip 40B are arranged so as to be shifted in the X-direction by the half pitch of the array pitch between the discharge channel 54 and the non-discharge channel 55 of the first head chip 40A. That is, the discharge channels 54 of the head chips 40A and 40B are arranged in zigzags, and the non-discharge channel 55 of the head chips 40A and 40B are arranged in zigzags.

That is, as illustrated in FIG. 4, the discharge channel 54 of the first head chip 40A faces the non-discharge channel 55 of the second head chip 40B in the Y-direction. As illustrated in FIG. 5, the non-discharge channel 55 of the first head chip 40A faces the discharge channel 54 of the second head chip 40B in the Y-direction. The pitch between the channels 54 and 55 in each of the head chips 40A and 40B may be appropriately changed.

Flow Passage Plate

The flow passage plate 41 is sandwiched between the first head chip 40A and the second head chip 40B in the Y-direction. The flow passage plate 41 is integrally formed of the same member. As illustrated in FIG. 3, the appearance of the flow passage plate 41 is a rectangular plate shape which is long in the X-direction and is short in the Z-direction. When viewed from the Y-direction, the appearance of the flow passage plate 41 is substantially the same as the appearance of the cover plate 52.

The CP-side-Y-direction inner side surface 52f2 in the first head chip 40A is bonded to a first main surface 41a (surface directed toward the first head chip 40A) of the flow passage plate 41 in the Y-direction. The CP-side-Y-direction inner side surface 52f2 in the second head chip 40B is bonded to a second main surface 41b (surface directed toward the second head chip 40B) of the flow passage plate 41 in the Y-direction.

The flow passage plate 41 is formed of a material which has insulating properties, and has thermal conductivity which is equal to or greater than that of the cover plate 52. For example, in a case where the cover plate 52 is formed of silicon, the flow passage plate 41 is preferably formed of silicon or carbon. Thus, it is possible to reduce temperature variation in the cover plate 52 between the head chips 40A and 40B. Therefore, it is possible to reduce temperature variation in the actuator plate 51 between the head chips 40A and 40B and to cause the temperature of an ink to be uniform. Thus, it is possible to cause a discharge speed of an ink to be uniform and to improve printing stability.

An inlet flow passage 74 and an outlet flow passage 75 are formed in each of the main surfaces 41f1 and 41f2 of the flow passage plate 41. The inlet flow passage 74 individually communicates with the common ink room 71. The outlet flow passage 75 individually communicates with the circulation passage 76 of the return plate 43.

The inlet flow passage 74 is recessed from each of the main surfaces 41f1 and 41f2 of the flow passage plate 41 toward the inner side thereof in the Y-direction. One end portion of the inlet flow passage 74 in the X-direction is opened in one end surface of the flow passage plate 41 in the X-direction. The inlet flow passage 74 is inclined to be positioned downwardly, as coming to the other end side thereof in the X-direction from one end surface of the flow passage plate 41 in the X-direction. Then, the inlet flow passage 74 is bent toward the other end side thereof in the X-direction, and extends to have a straight-line shape. As illustrated in FIG. 4, the width of the inlet flow passage 74 in the Z-direction is substantially equal to the width of the common ink room 71 in the Z-direction. The width of the inlet flow passage 74 in the Z-direction may be equal to or smaller than the width of the common ink room 71 in the Z-direction.

The inlet flow passages 74 are arranged between the first head chip 40A and the second head chip 40B in the Y-direction, so as to be spaced from each other in the Y-direction. That is, in the flow passage plate 41, a portion between the inlet flow passages 74 in the Y-direction is partitioned by a wall member. Thus, pressure fluctuation in the channel, which occurs when an ink is discharged is blocked by the wall member. Accordingly, it is possible to suppress the occurrence of so-called crosstalk in which the pressure fluctuation propagates as a pressure wave, to another channel and the like through the flow passage between the head chips 40A and 40B. Thus, it is possible to obtain excellent discharge performance (printing stability).

As illustrated in FIG. 3, the outlet flow passage 75 is recessed from each of the main surfaces 41f1 and 41f2 of the flow passage plate 41 toward the inner side thereof in the Y-direction, and is recessed upwardly from the lower end surface of the flow passage plate 41. One end portion of the outlet flow passage 75 is opened in the other end surface of the flow passage plate 41 in the X-direction. The outlet flow passage 75 is bent downward from the other end surface of the flow passage plate 41 in the X-direction, so as to have a crank shape. Then, the outlet flow passage 75 extends toward the one end side thereof in the X-direction, so as to have a straight-line shape. As illustrated in FIG. 4, the width of the outlet flow passage 75 in the Z-direction is smaller than the width of the inlet flow passage 74 in the Z-direction.

The depth of the outlet flow passage 75 in the Y-direction is substantially equal to the depth of the inlet flow passage 74 in the Y-direction.

The outlet flow passage 75 is connected to the outlet manifold (not illustrated) on the other end surface of the flow passage plate 41 in the X-direction. The outlet manifold is connected to the ink discharge tube 22 (see FIG. 1).

The outlet flow passages 75 are arranged between the first head chip 40A and the second head chip 40B in the Y-direction, so as to be spaced from each other in the Y-direction. That is, in the flow passage plate 41, a portion between the outlet flow passages 75 in the Y-direction is partitioned by a wall member. Thus, pressure fluctuation in the channel, which occurs when an ink is discharged is blocked by the wall member. Accordingly, it is possible to suppress the occurrence of so-called crosstalk in which the pressure fluctuation propagates as a pressure wave, to another channel and the like through the flow passage between the head chips 40A and 40B. Thus, it is possible to obtain excellent discharge performance (printing stability).

When the section in FIG. 4 is viewed, the inlet flow passage 74 and the outlet flow passage 75 are not formed at a portion of the flow passage plate 41, which overlaps the CP-side tail portion 52e in the Y-direction. That is, the portion of the flow passage plate 41, which overlaps the CP-side tail portion 52e in the Y-direction is set to be the solid member. Thus, in comparison to a case the portion of the flow passage plate 41, which overlaps the CP-side tail portion 52e in the Y-direction is set to be a hollow member, it is possible to avoid poor crimping occurring by a space between members at a time of connection, when the flow passage plate 41 and the cover plate 52 are connected to each other.

Inlet Manifold

As illustrated in FIG. 3, the inlet manifold 42 is collectively bonded to one end surface of the head chips 40A and 40B and the flow passage plate 41 in the X-direction. A supply passage 77 which communicates with each of inlet flow passages 74 is formed in the inlet manifold 42. The supply passage 77 is recessed from the inner end surface of the inlet manifold 42 in the X-direction toward the outside thereof in the X-direction. The supply passage 77 collectively communicates with the inlet flow passages 74. The inlet manifold 42 is connected to the ink supply tube 21 (see FIG. 1).

Return Plate

The appearance of the return plate 43 is a rectangular plate shape which is long in the X-direction and is short in the Y-direction. The return plate 43 is collectively bonded to lower end surfaces of the head chips 40A and 40B and the flow passage plate 41. In other words, the return plate 43 is disposed on the opening end side of the discharge channels 54 in the first head chip 40A and the second head chip 40B. The return plate 43 is a spacer plate which is interposed between the opening ends of the discharge channels 54 in the first head chip 40A and the second head chip 40B, and the upper end of the nozzle plate 44. A plurality of circulation passages 76 that respectively connect the discharge channels 54 in the head chips 40A and 40B to the outlet flow passage 75 are formed in the return plate 43. The plurality of circulation passages 76 include first circulation passages 76a and second circulation passages 76b. The plurality of circulation passages 76 penetrate the return plate 43 in the Z-direction.

As illustrated in FIG. 4, the first circulation passages 76a are formed at positions which are substantially the same as those of the discharge channels 54 of the first head chip 40A in the X-direction, respectively. A plurality of first circulation passages 76a are formed to be spaced from each other in the X-direction, corresponding to the array pitch between the discharge channels 54 in the first head chip 40A.

The first circulation passage 76a extends in the Y-direction. The inner side end portion of the first circulation passage 76a in the Y-direction is positioned on an inner side from the CP-side-Y-direction inner side surface 52f2 of the first head chip 40A in the Y-direction. The inner side end portion of the first circulation passage 76a in the Y-direction communicates with the inside of the outlet flow passage 75. The outer side end portion of the first circulation passage 76a in the Y-direction individually communicates with the inside of the corresponding discharge channel 54 in the first head chip 40A.

The cross-sectional area obtained when a portion of the discharge channel 54 in the first head chip 40A, which faces the return plate 43 is cut out at a plane which is orthogonal to the flowing direction of an ink is referred to as "a channel-side flow passage cross-sectional area" below. Here, the portion of the discharge channel 54 in the first head chip 40A, which faces the return plate 43 means a portion (boundary portion) at which the discharge channel 54 and the first circulation passage 76a are in contact with each other. That is, the channel-side flow passage cross-sectional area means an opening area of a downstream side end of the discharge channel 54 of the first head chip 40A in the flowing direction of an ink.

The cross-sectional area obtained when the first circulation passage 76a is cut out at a plane which is orthogonal to the flowing direction of an ink is referred to as "a circulation passage-side flow passage cross-sectional area" below. That is, the circulation passage-side flow passage cross-sectional area means a cross-sectional area when the first circulation passage 76 is cut out at a plane which is orthogonal to an extension direction of the first circulation passage 76.

In the embodiment, the circulation passage-side flow passage cross-sectional area is smaller than the channel-side flow passage cross-sectional area. Thus, in comparison to a case where the circulation passage-side flow passage cross-sectional area is greater than the channel-side flow passage cross-sectional area, it is possible to suppress the occurrence of so-called crosstalk in which pressure fluctuation which occurs, for example, when an ink is discharged propagates as a pressure wave, to another channel and the like through the flow passage. Thus, it is possible to obtain excellent discharge performance (printing stability).

As illustrated in FIG. 5, the second circulation passages 76b are formed at positions which are substantially the same as those of the discharge channels 54 of the second head chip 40B in the X-direction, respectively. A plurality of second circulation passages 76b are formed to be spaced from each other in the X-direction, corresponding to the array pitch between the discharge channels 54 in the second head chip 40B.

The second circulation passage 76b extends in the Y-direction. The inner side end portion of the second circulation passage 76b in the Y-direction is positioned on an inner side from the CP-side-Y-direction inner side surface 52f2 of the second head chip 40B in the Y-direction. The inner side end portion of the second circulation passage 76b in the Y-direction communicates with the inside of the outlet flow passage 75. The outer side end portion of the second circulation passage 76b in the Y-direction individually communicates with the inside of the corresponding discharge channel 54 in the second head chip 40B.

Nozzle Plate

As illustrated in FIG. 3, the appearance of the nozzle plate 44 is a rectangular plate shape which is long in the X-direction and is short in the Y-direction. The appearance of the nozzle plate 44 is substantially the same as the appearance of the return plate 43. The nozzle plate 44 is bonded to the lower end surface of the return plate 43. A plurality of nozzle holes (ejection holes) 78 which penetrate the nozzle plate 44 in the Z-direction are arranged in the nozzle plate 44. The plurality of nozzle holes 78 includes first nozzle holes 78a and second nozzle holes 78b. The plurality of nozzle holes 78 penetrate the nozzle plate 44 in the Z-direction.

As illustrated in FIG. 4, the first nozzle holes 78a are formed at portions of the nozzle plate 44, which face the first circulation passages 76a of the return plate 43 in the Z-direction, respectively. That is, the first nozzle holes 78a are arranged on a straight line, so as to be spaced from each other in the X-direction and to have a pitch which is the same as that of the first circulation passages 76a. The first nozzle hole 78a communicates with the inside of the first circulation passage 76a at the outer end portion of the first circulation passage 76a in the Y-direction. Thus, the first nozzle hole 78a communicates with the corresponding discharge channel 54 of the first head chip 40A through the corresponding first circulation passage 76a.

As illustrated in FIG. 5, the second nozzle holes 78b are formed at portions of the nozzle plate 44, which face the second circulation passages 76b of the return plate 43 in the Z-direction, respectively. That is, the second nozzle holes 78b are arranged on a straight line, so as to be spaced from each other in the X-direction and to have a pitch which is the same as that of the second circulation passages 76b. The second nozzle hole 78b communicates with the inside of the second circulation passage 76b at the outer end portion of the second circulation passage 76b in the Y-direction. Thus, the second nozzle hole 78b communicates with the corresponding discharge channel 54 of the second head chip 40B through the corresponding second circulation passage 76b.

Meanwhile, the non-discharge channel 55 does not communicate with the nozzle holes 78a and 78b, and is covered from a lower part by the return plate 43.

Operation Method of Printer

Next, an operation method of the printer 1 in a case where letters, figures, or the like are recorded on a recording medium P by using the printer 1 will be described.

A state where the four ink tanks illustrated in FIG. 1 which respectively have sufficient inks 4 of different colors are sealed is assumed as an initial state. A state where the ink jet head 5 is filled with the inks in the ink tanks 4 through the ink circulation means 6 is assumed.

As illustrated in FIG. 1, if the printer 1 in the initial state is operated, the grit rollers 11 and 13 of the transporting means 2 and 3 rotate so as to transport a recording medium P in a transport direction (X-direction) between the grit rollers 11 and 13, and the pinch rollers 12 and 14. Simultaneous with transporting of the recording medium P, the driving motor 38 rotates the pulleys 35 and 36 so as to operate the endless belt 37. Thus, the carriage 33 moves with reciprocating, in the Y-direction while being guided by the guide rails 31 and 32.

Since the inks of four colors are appropriately discharged to the recording medium P by the ink jet heads 5 during a period when the carriage 33 moves with reciprocating, letters, an image, or the like can be recorded on a recording medium P.

Here, motion of each of the ink jet heads 5 will be described.

In a vertical circulation type ink jet head 5 in the edge shoot type as in the embodiment, firstly, the pressure pump 24 and the suction pump 25 illustrated in FIG. 2 are operated, and thus an ink is caused to flow in the circulation flow passage 23. In this case, the ink flowing in the ink supply tube 21 flows into each of the inlet flow passages 74 of the flow passage plate 41, through the supply passage 77 of the inlet manifold 42 illustrated in FIG. 3. The ink flowing into each of the inlet flow passages 74 passes through the common ink room 71. Then, the ink is supplied into the discharge channels 54 through the slits 72, respectively. The ink flowing into the discharge channels 54 are collected in the outlet flow passage 75 through the circulation passage 76 of the return plate 43. Then, the ink is discharged to the ink discharge tube 22 illustrated in FIG. 2, through the outlet manifold (not illustrated). The ink discharged to the ink discharge tube 22 is brought back to the ink tank 4. Then, the ink is supplied to the ink supply tube 21 again. Thus, the ink is circulated between the ink jet head 5 and the ink tank 4.

If moving with reciprocating is started by the carriage 33 (see FIG. 1), a driving voltage is applied to the electrodes 61 and 63 via the flexible substrate 45. At this time, the driving voltage is applied between the electrodes 61 and 63, in a state where the individual electrode 63 is set to have a driving potential Vdd and the common electrode 61 is set to have a reference potential GND. If the voltage is applied, thickness shear deformation occurs in two drive walls 56 that define the discharge channel 54. Thus, the two drive walls 56 are deformed to protrude toward the non-discharge channel 55 side. That is, since two piezoelectric substrates which are polarized in the thickness direction (Y-direction) are stacked, if the driving voltage is applied, the actuator plate 51 in the embodiment is deformed and bent to have a V-shape by using the intermediate position of the drive wall 56 in the Y-direction, as the center. Thus, the discharge channel 54 deforms as it expands, for example.

If the volume of the discharge channel 54 is increased by the deformation of the two drive walls 56, an ink in the common ink room 71 is guided into the discharge channel 54 through the corresponding slits 72. The ink guided into the discharge channel 54 propagates in the discharge channel 54 in a form of a pressure wave. The driving voltage applied between the electrodes 61 and 63 reaches the zero at a timing when the pressure wave reaches the nozzle hole 78.

Thus, the drive wall 56 is restored, and the volume of the discharge channel 54, which has been temporarily increased returns to the original volume. With this operation, pressure in the discharge channel 54 is increased, and thus the ink is pressurized. As a result, it is possible to discharge the ink from the nozzle hole 78. At this time, when the ink passes through the nozzle hole 78, the ink is discharged in a form of an ink droplet having a droplet shape. Thus, as described above, letters, an image, or the like can be recorded on the recording medium P.

The operation method of the ink jet head 5 is not limited to the above-described details. For example, a configuration in which the drive wall 56 in a normal state is deformed to the inner side of the discharge channel 54, and thus the discharge channel 54 is, for example, recessed toward the inner side thereof may be made. In this case, this configuration may be realized by setting the voltage applied between the electrodes 61 and 63 to a voltage reversed to the above-described voltage, or by setting the polarization direction of the actuator plate 51 to be reversed without changing the applied direction of the voltage. In addition, a pressurized force of an ink when being discharged may increase in a manner that the discharge channel 54 is deformed bulging outwardly, and then deforms recessed to the inner side.

Manufacturing Method of Ink Jet Head

Next, a manufacturing method of the ink jet head 5 will be described. The manufacturing method of the ink jet head 5 in the embodiment includes a head chip production process, a flow-passage plate production process, a various-plate bonding process, and a return-plate-and-like bonding process. The head chip production process may be performed for the head chips 40A and 40B, by using the similar method. Thus, in the following descriptions, the head chip production process for the first head chip 40A will be described.

Head Chip Production Process

In the embodiment, the head chip production process includes a wafer preparation process, a mask pattern forming process, a channel forming process, and an electrode forming process, as processes on the actuator plate side.

Figure 9:
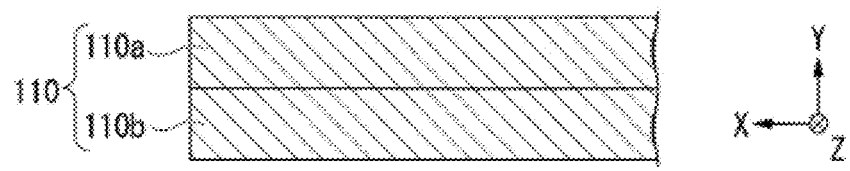
FIG. 9 is a process chart illustrating a wafer preparation process.

As illustrated in FIG. 9, in the wafer preparation process, firstly, two piezoelectric wafers 110a and 110b which are polarized in a thickness direction (Y-direction) are stacked in a state where a polarization direction is set to be a reverse direction. Thus, a Chevron type actuator wafer 110 is formed.

Then, the front surface (one piezoelectric wafer 110a) of the actuator wafer 110 is ground. In the embodiment, a case where the piezoelectric wafers 110a and 110b having the same thickness are stuck to each other is described. However, piezoelectric wafers 110a and 110b having a thickness different from each other may be stuck to each other in advance.

Figure 10:
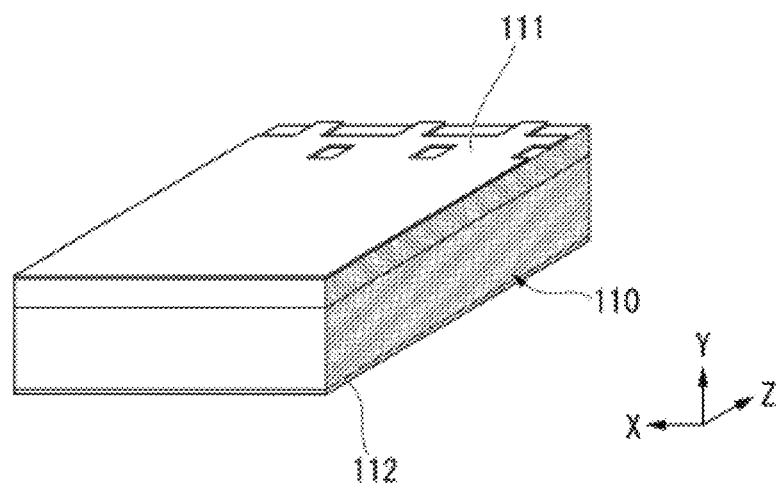
FIG. 10 is a process chart illustrating a mask pattern forming process in the embodiment.

As illustrated in FIG. 10, in the mask pattern forming process, a mask pattern 111 used in the electrode forming process is formed. Specifically, a mounting tape 112 is put on the back surface of the actuator wafer 110. Then, a mask material such as a photosensitive dry film is put on the front surface of the actuator wafer 110. Then, patterning is performed on the mask material by using a photolithography technology, and thus a partial mask material of the mask material, which is positioned in a region for forming the AP-side common pad 62 and the AP-side individual wiring 64 (see FIG. 7) which are described above is removed. Thus, the mask pattern 111 in which at least the region for forming the AP-side common pad 62 and the AP-side individual wiring 64 is opened is formed on the front surface of the actuator wafer 110. In this case, the mask pattern 111 covers a portion of the actuator wafer 110, except for the region for forming the AP-side common pad 62 and the AP-side individual wiring 64. The mask material may be formed, for example, by coating the front surface of the actuator wafer 110.

Figure 11:
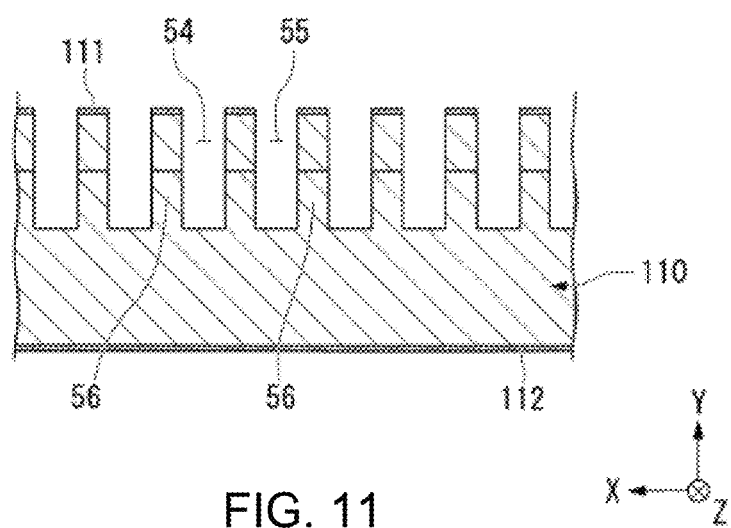
FIG. 11 is a process chart illustrating a channel forming process in the embodiment.
Figure 12:
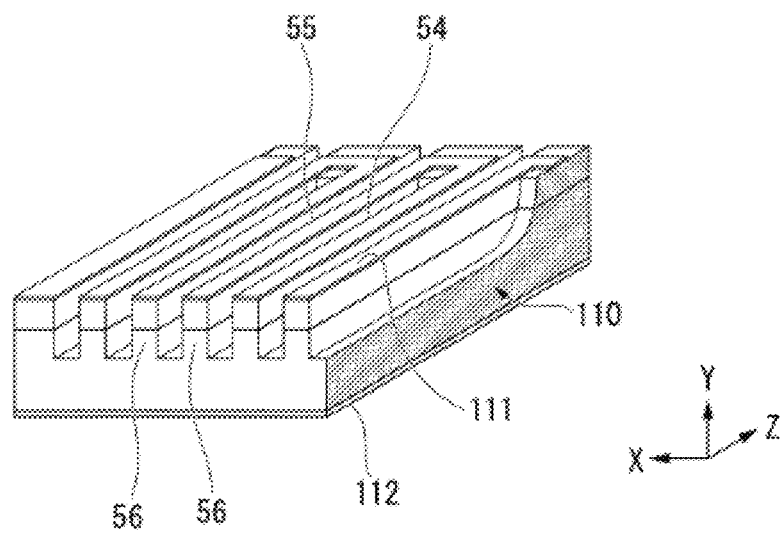
FIG. 12 is a process chart illustrating the channel forming process in the embodiment.

As illustrated in FIG. 11, in the channel forming process, cutting is performed on the front surface of the actuator wafer 110 by a dicing blade and the like (not illustrated). Specifically, as illustrated in FIG. 12, the plurality of channels 54 and 55 are formed on the front surface of the actuator wafer 110, so as to be arranged in parallel at a distance in the X-direction. In this case, a region for forming each of the channels 54 and 55, on the front surface of the actuator wafer 110, is cut out in accordance with the above-described mask pattern 111.

The order of the processes in the mask pattern forming process and the channel forming process which are described above may be reversed so long as the mask pattern 111 can be formed to have a desired shape. In the above-described mask pattern forming process, the mask material at a portion positioned in a region of forming the discharge channels 54 and the non-discharge channels 55 may be removed in advance.

The electrode forming process includes a degreasing process, an etching process, a lead leaching process, a catalyst impartation process, a mask removal process, a plating process, and a plating film removal process.

In the degreasing process, contaminants such as oils and fats, which are attached to the actuator wafer 110 are removed.

In the etching process, the actuator wafer 110 is etched by an ammonium fluoride solution or the like. Thus, an adhesive force between a plating film formed in the plating process, and the actuator wafer 110 is improved.

In the lead leaching process, in a case where the actuator wafer 110 is formed of PZT, lead in the front surface of the actuator wafer 110 is removed. Thus, a catalyst suppression effect of lead on the surface of the actuator wafer 110 is suppressed.

Figure 13:
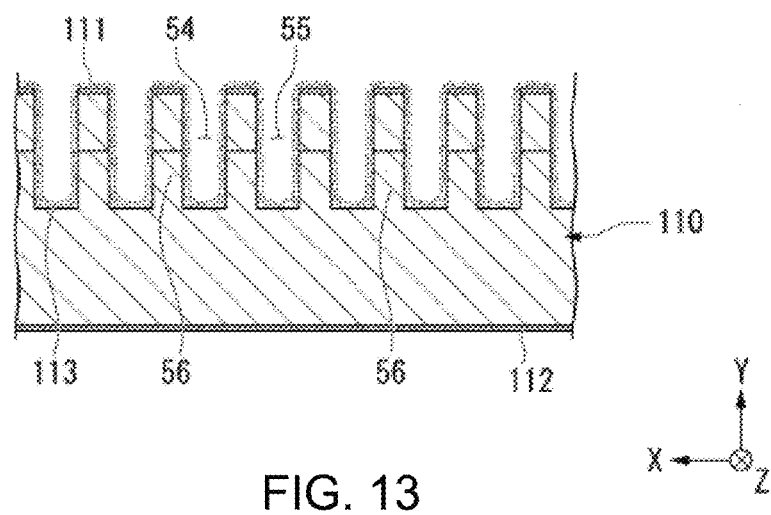
FIG. 13 is a process chart illustrating a catalyst impartation process in the embodiment.

For example, the catalyst impartation process is performed by a sensitizer and activator method. As illustrated in FIG. 13, in the sensitizer and activator method, firstly, a sensitization treatment in which the actuator wafer 110 is immersed in a stannous chloride aqueous solution so as to cause stannous chloride to be attracted to the actuator wafer 110 is performed. Then, the actuator wafer 110 is lightly washed by rinsing or the like. Then, the actuator wafer 110 is immersed in a palladium chloride aqueous solution, so as to cause palladium chloride to be attracted to the actuator wafer 110. If the immersing is performed, an oxidation-reduction reaction occurs between palladium chloride attracted to the actuator wafer 110 and stannous chloride which has been attracted in the above-described sensitization treatment. Thus, metal palladium as a catalyst 113 is precipitated (activating treatment). The catalyst impartation process may be performed plural number of times.

The catalyst impartation process may be performed by a method other than the above-described sensitizer and activator method. For example, the catalyst impartation process may be performed by a catalyst accelerator method. In the catalyst accelerator method, the actuator wafer 110 is immersed in a colloidal solution of tin and palladium. Then, the actuator wafer 110 is immersed in an acidic solution (for example, hydrochloric acid solution) so as to be activated. Thus, metal palladium is precipitated on the front surface of the actuator wafer 110.

Figure 14:
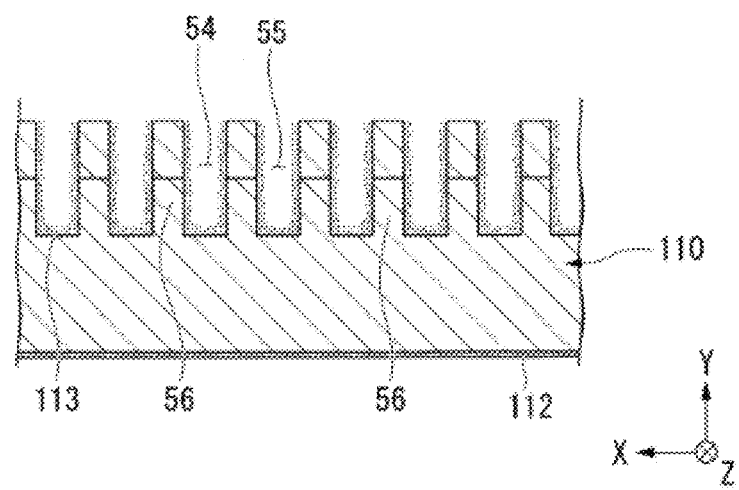
FIG. 14 is a process chart illustrating a mask removal process in the embodiment.

Then, as illustrated in FIG. 14, in the mask removal process, the mask pattern 111 formed on the front surface of the actuator wafer 110 is removed, for example, by lifting-off. A portion of the catalyst 113, which is imparted onto the mask pattern 111 is removed along with the mask pattern 111. That is, in the embodiment, the catalyst 113 remains only at a portion of the actuator wafer 110, which is exposed from the mask pattern 111 (inner surface of each of the channels 54 and 55, the region for forming the AP-side common pad 62 and the AP-side individual wiring 64, and the like). The mask removal process may be performed after the plating process.

Figure 15:
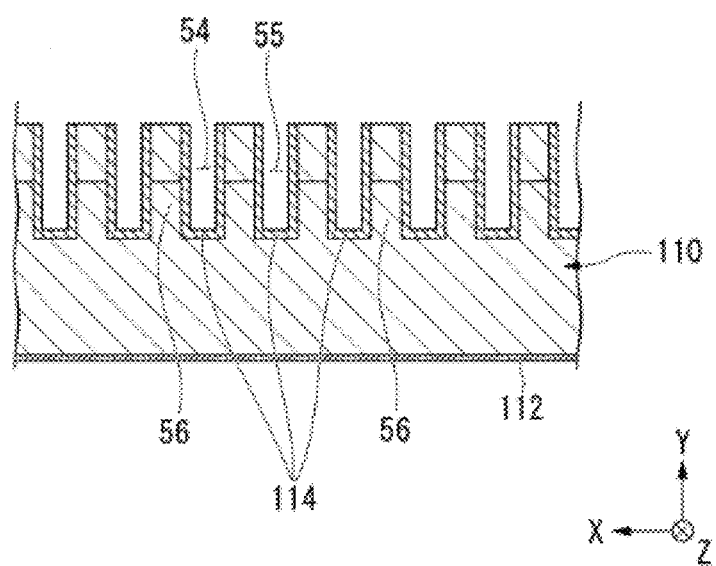
FIG. 15 is a process chart illustrating a plating process in the embodiment.

As illustrated in FIG. 15, in the plating process, the actuator wafer 110 is immersed in a plating solution. If the actuator wafer 110 is immersed in a plating solution, a metal film 114 is formed at the portion of the actuator wafer 110, onto which the catalyst 113 is imparted, by precipitation. As electrode metal used in the plating process, for example, Ni (nickel), Co (cobalt), Cu (copper), Au (gold), and the like are preferable. In particular, Ni is preferably used.

Figure 16:
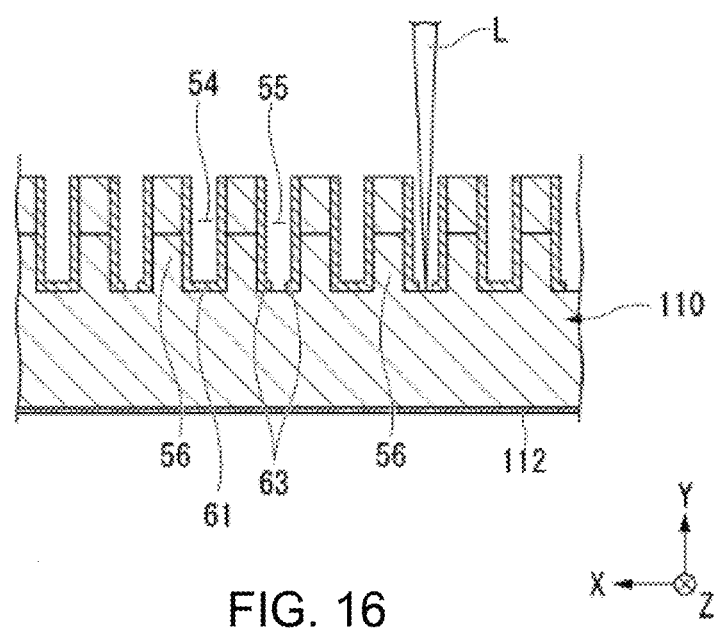
FIG. 16 is a process chart illustrating a plating film removal process in the embodiment.

As illustrated in FIG. 16, in the plating film removal process, a portion of the metal film 114 (see FIG. 15), which is positioned on the bottom surface of the non-discharge channel 55 is removed. Specifically, scanning with a laser beam L is performed in the Z-direction, in a state where the bottom surface of the non-discharge channel 55 is irradiated with the laser beam L. If the scanning is performed, a portion of the metal film 114 (see FIG. 15), which is irradiated with the laser beam L is selectively removed. Thus, the metal film 114 (see FIG. 15) is divided by the bottom surface of the non-discharge channel 55. Accordingly, in the actuator wafer 110, the common electrode 61 and the individual electrode 63 are respectively formed on the inner surfaces of the channels 54 and 55, respectively. The AP-side common pad 62 and the AP-side individual wiring 64 (see FIG. 7) which are connected to the corresponding common electrode 61 and to the corresponding individual electrode 63 are formed on the front surface of the actuator wafer 110.

Instead of the laser beam L, a dicer may be used. The plating film removal process is not limited to removing of the portion of the metal film 114, which is positioned on the bottom surface of the non-discharge channel 55. For example, in a catalyst removal process, a portion of the catalyst 113, which is positioned on the bottom surface of the non-discharge channel 55 may be removed. Specifically, in the catalyst removal process, scanning with a laser beam L may be performed in the Z-direction, in a state where the bottom surface of the non-discharge channel 55 is irradiated with the laser beam L. Thus, the portion of the catalyst 113, which is irradiated with the laser beam L may be selectively removed.

Then, the mounting tape 112 is peeled off, and the actuator wafer 110 is fragmented by using a dicer or the like. Accordingly, the above-described actuator plate 51 (see FIG. 5) is completed.

In the embodiment, the head chip production process includes a common ink room forming process, a slit forming process, a recess portion forming process, and an electrode-and-wiring forming process, as processes of the cover plate side.

Figure 17:
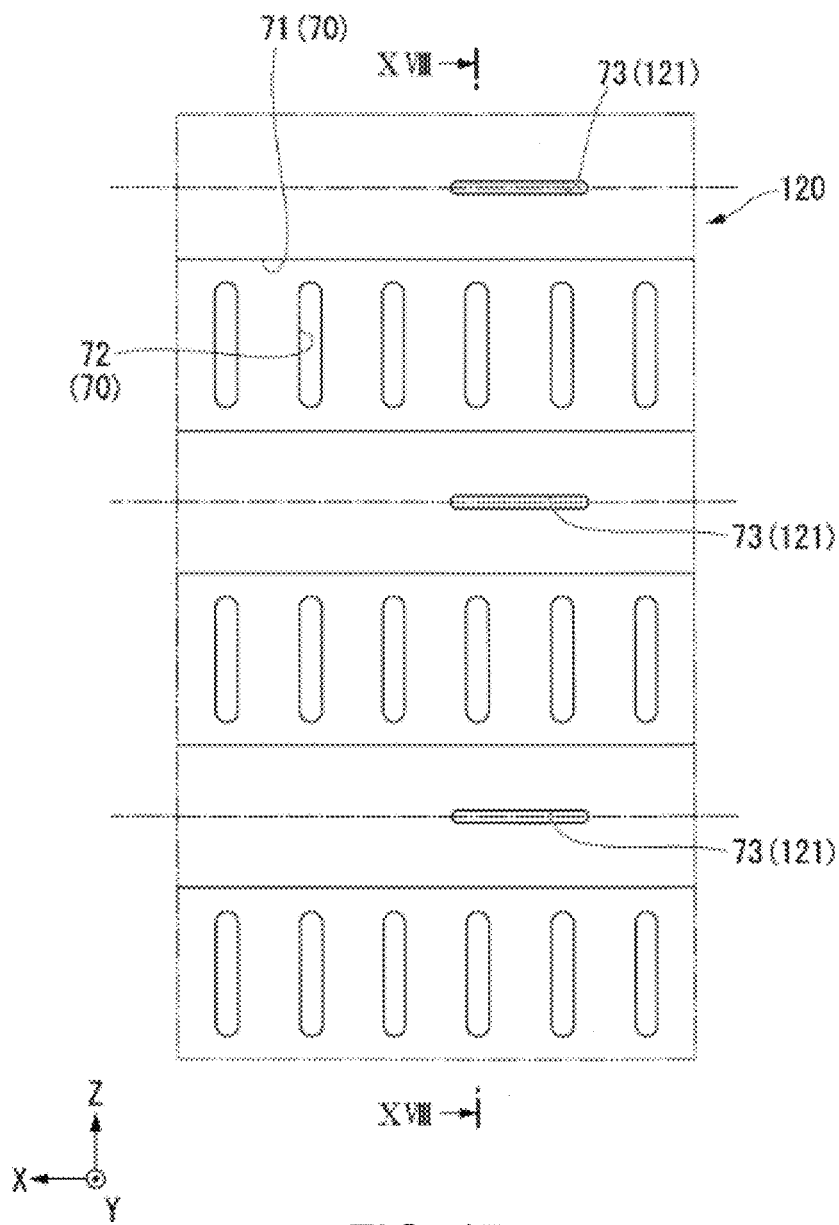
FIG. 17 is a process chart (plan view) illustrating a cover plate production process in the embodiment.

As illustrated in FIG. 17, in the common ink room forming process, firstly, sand blasting or the like is performed on a cover wafer 120 from the front surface side, through a mask (not illustrated), and thereby the common ink room 71 is formed.

Figure 18:
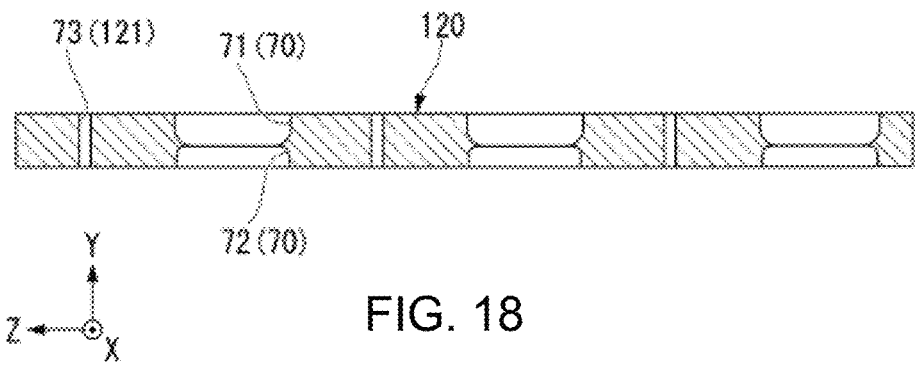
FIG. 18 is a view illustrating a section taken along XVIII-XVIII in FIG. 17.

As illustrated in FIG. 18, in the slit forming process, sand blasting or the like is performed on the cover wafer 120 from the back surface side, through a mask (not illustrated), and thereby slits 72 which individually communicate with the inside of the common ink room 71 are formed.

In the recess portion forming process, as illustrated in FIG. 17, sand blasting or the like is performed on the cover wafer 120 from the front surface side or the back surface side, through a mask (not illustrated), and thereby the slit 121 for forming the recess portion 73 (see FIG. 7) is formed. Then, cover wafer 120 is fragmented along an axis of the slit 121 by using a dicer or the like. Accordingly, the recess portion 73 is formed in the cover wafer 120. Thus, the cover plate 52 (see FIG. 3) in which the recess portion 73 is formed is completed.

Each of the common ink room forming process, the slit forming process, and the recess portion forming process is not limited to sand blasting, and may be performed by dicing, cutting, or the like.

Figure 19:
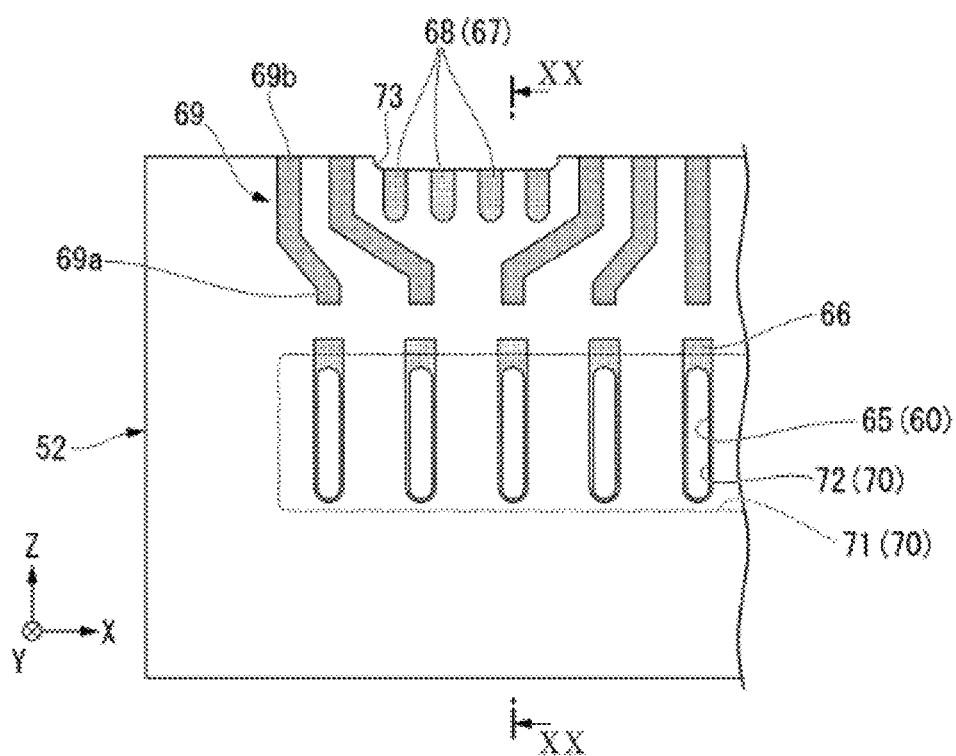
FIG. 19 is a diagram illustrating a common wiring forming process and an individual wiring forming process in the embodiment.

Then, as illustrated in FIG. 19, in the electrode-and-wiring forming process, various electrodes and wirings such as the in-liquid-supply-passage electrode 65, the CP-side common pad 66, the common lead wiring 67, and the CP-side individual wiring 69 are formed in the cover plate 52.

Figure 20:
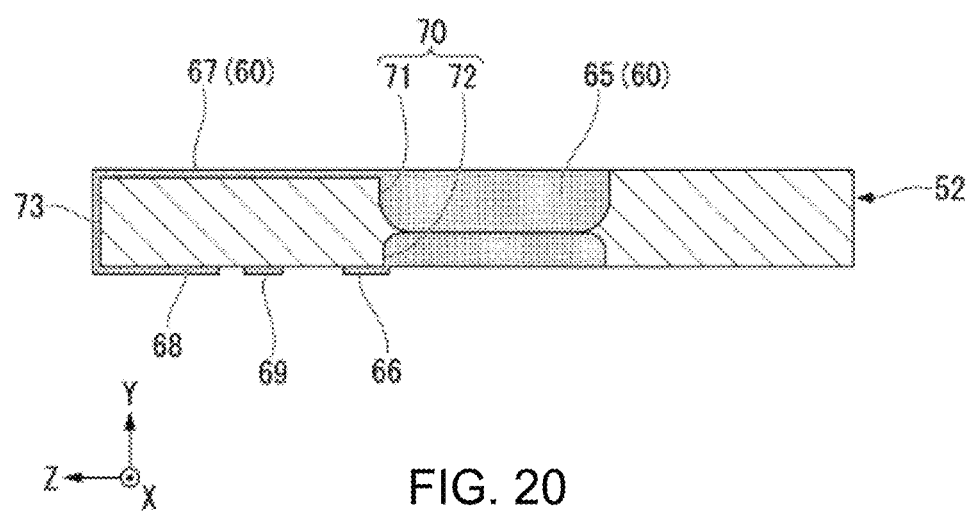
FIG. 20 is a view illustrating a section taken along XX-XX in FIG. 19.

Specifically, in the electrode-and-wiring forming process, as illustrated in FIG. 20, firstly, a mask (not illustrated) is disposed on the entire surface (including the front surface, the back surface, the upper end surface, and a surface in which the recess portion 73 is formed) of the cover plate 52. In the mask, regions for forming various electrodes and various wirings (in-liquid-supply-passage electrode 65, CP-side common pad 66, common lead wiring 67, and CP-side individual wiring 69) are opened. Then, a film of an electrode material is formed on the entire surface of the cover plate 52 by electroless plating or the like. Thus, the film of the electrode material, which will function as the various electrodes and the various wirings is formed on the entire surface of the cover plate 52 through openings of the mask. As the mask, for example, a photosensitive dry film or the like may be used. The electrode-and-wiring forming process is not limited to plating, and may be performed by vapor deposition and the like.

After the electrode-and-wiring forming process ends, the mask is removed from the entire surface of the cover plate 52.

The actuator plates 51 are bonded to the cover plates 52, and thereby the head chips 40A and 40B are produced. Specifically, the AP-side-Y-direction inner side surface 51f1 is stuck to the CP-side-Y-direction outer side surface 52f1.

Flow-passage Plate Production Process

In the embodiment, the flow-passage plate production process includes a flow passage forming process and a fragmentation process.

Figure 21:
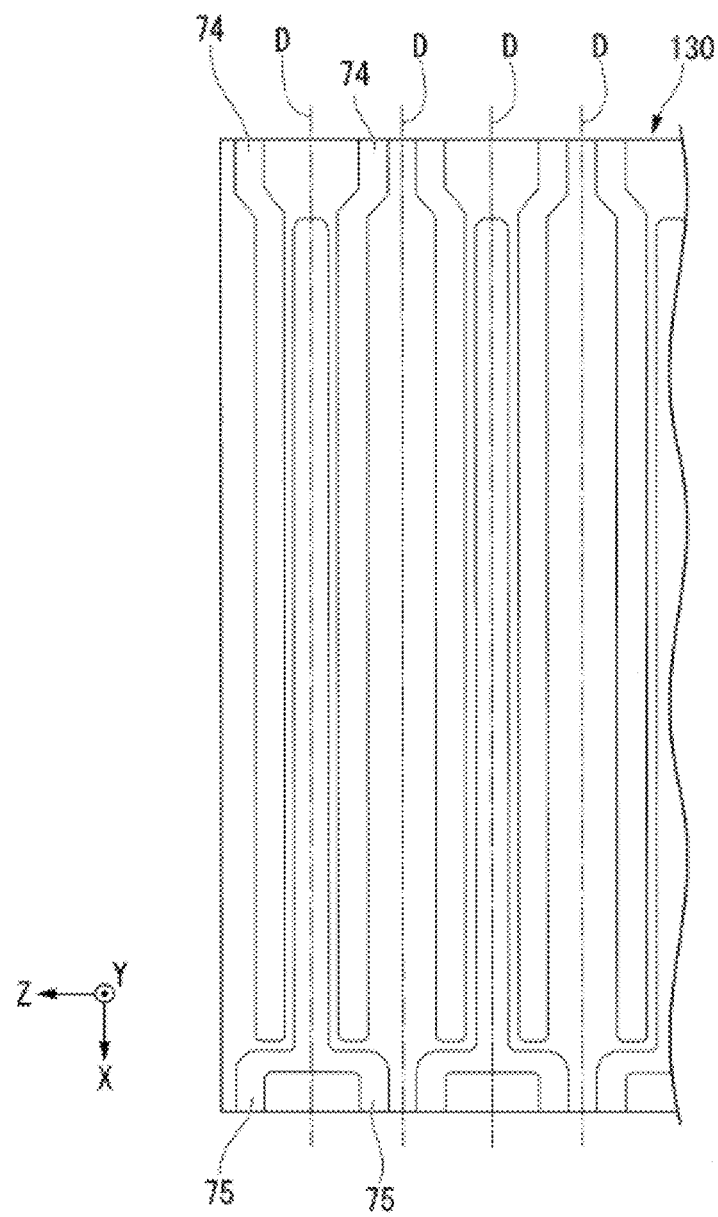
FIG. 21 is a diagram illustrating a flow-passage plate production process in the embodiment.

As illustrated in FIG. 21, in the flow passage forming process (flow passage forming process of the front surface side), firstly, sand blasting or the like is performed on a flow passage wafer 130 from the front surface side, through a mask (not illustrated), and thereby the inlet flow passage 74 and the outlet flow passage 75 are formed.

In addition, in the flow passage forming process (flow passage forming process of the back surface side), sand blasting or the like is performed on the flow passage wafer 130 from the back surface side, through a mask (not illustrated), and thereby the inlet flow passage 74 and the outlet flow passage 75 are formed. Each of the processes in the flow passage forming process is not limited to sand blasting, and may be performed by dicing, cutting, and the like.

Then, in the fragmentation process, the flow passage wafer 130 is fragmented by using a dicer or the like. The fragmentation is performed along an axis (virtual line D) of a straight-line portion of the outlet flow passage 75 in the X-direction. Thus, the flow passage plate 41 (see FIG. 3) is completed.

Various-plate Bonding Process

Figure 22:
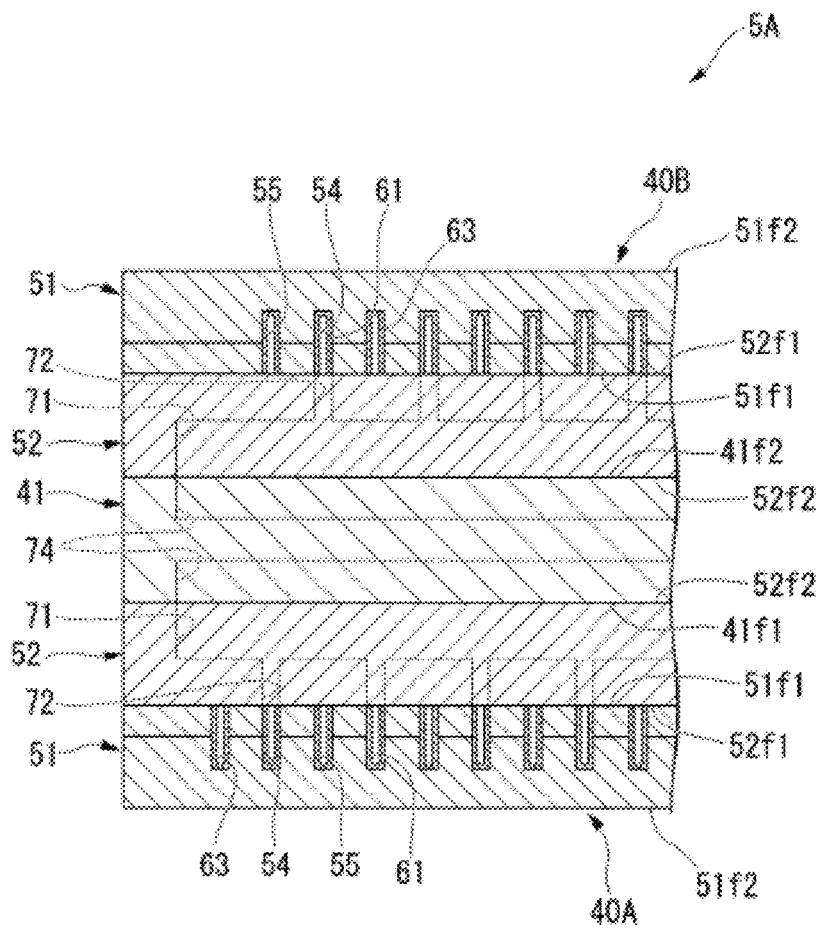
FIG. 22 is a view illustrating a section taken along XXII-XXII in FIG. 4, and is a process chart illustrating a various-plate bonding process.

Then, as illustrated in FIG. 22, in the various-plate bonding process, the cover plates 52 in the head chips 40A and 40B are bonded to the flow passage plate 41. Specifically, the outer side surfaces (main surfaces 41f1 and 41f2) of the flow passage plate 41 in the Y-direction are stuck to CP-side-Y-direction inner side surfaces 52f2 of the head chips 40A and 40B.

Thus, a plate bonded body 5A is produced.

After all the plates in a wafer state are stuck to each other, chip division (fragmentation) may be performed.

Return-plate-and-like Bonding Process

Then, the return plate 43 and the nozzle plate 44 are bonded to the plate bonded body 5A. Then, the flexible substrate 45 (see FIG. 4) is mounted on the CP-side tail portion 52e.

With the above processes, the ink jet head 5 in the embodiment is completed.

As described above, in the embodiment, the head chips 40A and 40B includes the actuator plate 51, the cover plate 52, the common electrode 61, and the connection wiring 60. In the actuator plate 51, the plurality of discharge channels 54 and the plurality of non-discharge channels 55 which extend in the Z-direction are arranged at a distance in the X-direction. The cover plate 52 is stacked on the AP-side-Y-direction inner side surface 51f1 so as to close the plurality of discharge channels 54 and the plurality of non-discharge channels 55. The common electrode 61 is formed on the inner surface of each of the discharge channels 54. The connection wiring 60 is divided so as to be formed in at least 3 or more places in the X-direction, on the cover plate 52, and connects the common electrode 61 and the flexible substrate 45.

According to the embodiment, since the connection wiring 60 is formed on the cover plate 52, it is possible to secure an area of a region in which the connection wiring 60 can be formed, without being influenced by the grooves such as the channels 54 and 55, in comparison to a case where the connection wiring 60 is formed on the actuator plate 51. Accordingly, it is possible to secure strength at a connection portion between various wirings, and to improve the degree of freedom of layouts for the various wirings and form a desired wiring pattern. In addition, since the connection wiring 60 is formed so as to be divided in the X-direction, it is possible to reduce the length of each of the head chips 40A and 40B in the Z-direction, in comparison to a case where the connection wiring 60 is formed so as to be divided in the Z-direction. Therefore, it is possible to reduce the size of each of the head chips 40A and 40B, and to increase the number of pieces taken from a wafer having a predetermined size. In addition, since the connection wiring 60 is divided so as to be formed in at least 3 or more places in the X-direction, it is possible to avoid an occurrence of inconvenience such as heating which occurs by concentration of a current on the connection wiring 60, in comparison to a case where the connection wiring 60 is partially formed (for example, at both ends of the cover plate 52 in the X-direction). In addition, it is possible to secure an area of a region in which the connection wiring 60 can be formed, without being influenced by the grooves such as the discharge channels 54 and the non-discharge channels 55. In particular, in the configuration in which the discharge channels 54 and the non-discharge channels 55 are formed in the actuator plate 51, a region of forming the channels easily becomes complicated in comparison to a configuration in which only the ejection channels are formed. Thus, it is preferable that strength at a connection portion between various wirings is secured, the degree of freedom of layouts for the various wirings is improved, and a desired wiring pattern is formed.

In the embodiment, the connection wiring 60 is formed at the CP-side tail portion 52e, in a stacked state of the actuator plate 51 and the cover plate 52.

According to the embodiment, it is possible to secure a wide area of the region in which the connection wiring 60 can be formed in the CP-side tail portion 52e. Accordingly, it is easy to secure strength at a connection portion between various wirings, and to improve the degree of freedom of layouts for the various wirings and form a desired wiring pattern.

In the embodiment, the liquid supply passage 70 which penetrates the cover plate 52 in the Y-direction and communicates with the discharge channels 54 is formed in the cover plate 52. The connection wiring 60 includes the in-liquid-supply-passage electrode 65 formed on the inner surface of the liquid supply passage 70 and the common lead wiring 67 which is divided so as to be formed in at least 3 or more places in the X-direction on the CP-side tail portion 52e. The common lead wiring 67 connects the in-liquid-supply-passage electrode 65 to the flexible substrate 45.

According to the embodiment, it is possible to electrically connect the common electrode 61 and the flexible substrate 45 via the in-liquid-supply-passage electrode 65 and the common lead wiring 67. Therefore, in comparison to a case where the connection wiring 60 is provided on a surface which is different from the inner surface of the liquid supply passage 70 (for example, in a case where the connection wiring 60 is provided on an inner surface of the AP-side tail portion 51e in the Y-direction), it is easy to cause the connection wiring 60 to be disposed at a position which avoids the actuator plate 51. In addition, since the common lead wiring 67 is divided so as to be formed in at least 3 or more places in the X-direction, it is possible to suppress an occurrence of dullness of a driving pulse, which occurs by a difference of a nozzle position in the X-direction, in comparison to a case where the common lead wiring 67 is partially formed (for example, at both ends of the cover plate in the X-direction). For example, in a case where the common lead wiring 67 is divided so as to be formed in three or more places in the X-direction, in comparison to a case where the common lead wiring 67 is divided so as to be formed only at both ends of the cover plate in the X-direction, it is possible to suppress an occurrence of a large potential difference between both of the ends thereof in the X-direction. Accordingly, it is possible to suppress the occurrence of a situation in which it is difficult to generate a desired driving pulse.

In the embodiment, the plurality of recess portions 73 which are recessed toward the inner side of the cover plate 52 and are arranged to be spaced from each other in the X-direction are formed at the upper end of the CP-side tail portion 52e. The common lead wiring 67 connects the in-liquid-supply-passage electrode 65 and the flexible substrate 45 through the recess portion 73.

According to this configuration, in comparison to a case where the common lead wiring 67 connects the in-liquid-supply-passage electrode 65 to the flexible substrate 45 through a through-hole 90 (see FIG. 24) which will be described later, it is possible to reduce the length of the head chips 40A and 40B in the Z-direction because it is sufficient that the cover plate 52 has a recess-portion forming region (for example, a region of forming the slit 121, illustrated in FIG. 17) which is smaller than a through-hole forming region.

In the embodiment, the liquid supply passage 70 includes the plurality of slits 72 which are opened in the CP-side-Y-direction outer side surface 52f1 so as to communicate with the discharge channels 54, and are disposed to be spaced from each other in the X-direction. The plurality of AP-side common pads 62 which extend from the common electrode 61 and are disposed to be spaced from each other in the X-direction are formed in the inner side surface of the AP-side tail portion 51e in the Y-direction. The plurality of CP-side common pads 66 which extend from the in-liquidsupply-passage electrode 65, are disposed to be spaced from each other in the X-direction, and respectively face the AP-side common pads 62 in the Y-direction are formed around the slits 72 in the CP-side-Y-direction outer side surface 52f1.

According to the embodiment, when the actuator plate 51 and the cover plate 52 are bonded to each other, the AP-side common pad 62 can be connected to the CP-side common pad 66. Thus, it is possible to easily connect the common electrode 61 to the flexible substrate 45 via the pads 62 and 66 and the like. In addition, the common electrode 61 formed on the inner surface of each of the plurality of discharge channels 54 is shared by the in-liquid-supply-passage electrode 65 through an individual slit 72 with passing from the AP-side common pad 62 through the CP-side common pad 66. The lead wiring 67 connected to the in-liquid-supply-passage electrode 65 extends up to the CP-side tail portion 52e. Thus, it is possible to easily perform electrode arrangement of the common electrode 61 and the individual electrode 63.

In the embodiment, the common lead wiring 67 includes common terminals 68 which are divided so as to be formed in at least 3 or more places in the X-direction, on the outer side surface of the CP-side tail portion 52e in the Y-direction. The common terminals 68 are connected to the flexible substrate 45.

According to the embodiment, since the common terminal 68 is formed on the outer side surface of the CP-side tail portion 52e in the Y-direction, it is possible to easily perform crimping work between the flexible substrate 45 and the common terminal 68, in comparison to a case where the common terminal 68 is formed on the inner side surface of the cover plate 52 in the Y-direction. In addition, since the common terminal 68 is divided so as to be formed in at least 3 or more places in the X-direction, it is possible to suppress an occurrence of dullness of a driving pulse, which occurs by a difference of a nozzle position in the X-direction, in comparison to a case where the common terminal 68 is partially formed (for example, at both ends of the cover plate in the X-direction).

In the embodiment, the AP-side individual wiring 64 which extends in the X-direction and connects individual electrodes 63 which face each other with the discharge channel 54 interposed between the individual electrodes 63 to each other is formed on the inner side surface of the AP-side tail portion 51e in the Y-direction. The CP-side individual wiring 69 which is divided in the X-direction in one end portion in the Z-direction is formed on the CP-side-Y-direction outer side surface 52f1. The CP-side individual wiring 69 includes the CP-side individual pad 69a which faces the AP-side individual wiring 64 in the Y-direction, and the individual terminal 69b which extends toward an upper end from the CP-side individual pad 69a.

According to the embodiment, when the actuator plate 51 and the cover plate 52 are bonded to each other, the AP-side individual wiring 64 can be connected to the CP-side individual pad 69a. Thus, it is possible to easily connect the individual electrode 63 to the flexible substrate 45 via the individual wirings 64 and 69, the individual pad 69a, and the like. In the embodiment, both of the individual terminal 69b and the common terminal 68 are formed on the CP-side-Y-direction outer side surface 52f1. Thus, in comparison to a case where the individual terminal 69b and the common terminal 68 are formed on a different surface of the cover plate 52, it is possible to easily perform crimping work between the individual terminal 69b and the common terminal 68, and the flexible substrate 45.

In the embodiment, the ink jet head 5 includes the head chips 40A and 40B.

According to the embodiment, in the ink jet head 5 which includes the head chips 40A and 40B, it is possible to secure strength at a connection portion between various wirings, and to improve the degree of freedom of layouts for the various wirings and form a desired wiring pattern. In addition, it is possible to reduce the length of the ink jet head 5 in the Z-direction. In addition, it is possible to avoid an occurrence of inconvenience such as heating which occurs by concentration of a current on the connection wiring 60. It is preferable that strength at a connection portion between various wirings is secured, the degree of freedom of layouts for the various wirings is improved, and a desired wiring pattern is formed.

In the embodiment, a pair of head chips 40A and 40B are disposed to face CP-side-Y-direction inner side surfaces 52f2 to each other in the Y-direction are provided. The liquid supply passage 70 which penetrates the cover plate 52 in the Y-direction and communicates with the discharge channels 54 is formed in the cover plate 52. The flow passage plate 41 is disposed between the pair of head chips 40A and 40B. The inlet flow passage 74 which communicates with liquid supply passages 70 of the pair of cover plates 52 is formed in the flow passage plate 41.

According to the embodiment, in each of the head chips 40A and 40B, the CP-side-Y-direction outer side surface 52f1 can be exposed to the outside thereof in the Y-direction. Thus, it is possible to easily connect the flexible substrate 45 to the connection wiring 60 in the two-row type ink jet head 5.

In the embodiment, each of the plurality of discharge channels 54 is opened in the lower end surface of the of the actuator plate 51 in each of the pair of head chips 40A and 40B. The nozzle plate 44 which has nozzle holes 78 which respectively communicate with the discharge channels 54 is disposed on the lower end surface of each of the pair of actuator plates 51. The return plate 43 which has the circulation passages 76 which cause the discharge channels 54 to respectively communicate with the nozzle holes 78 is disposed between the pair of actuator plates 51 and the nozzle plate 44 in the Z-direction. The outlet flow passage 75 which communicates with the circulation passage 76 is formed in the flow passage plate 41.

According to the embodiment, it is possible to circulate a liquid between each of the discharge channels 54 and the ink tank 4. Thus, it is possible to suppress staying of bubbles near the nozzle hole 78 in the discharge channel 54.

The printer 1 according to the embodiment includes the above-described ink jet head 5, and moving mechanisms 2, 3, and 7 that relatively move the ink jet head 5 and a recording medium P.

According to the embodiment, in the printer 1 which includes the ink jet head 5, it is possible to secure strength at a connection portion between various wirings, and to improve the degree of freedom of layouts for the various wirings and form a desired wiring pattern. In addition, it is possible to reduce the length of the ink jet head 5 in the Z-direction. In addition, it is possible to avoid an occurrence of inconvenience such as heating which occurs by concentration of a current on the connection wiring 60. It is preferable that strength at a connection portion between various wirings is secured, the degree of freedom of layouts for the various wirings is improved, and a desired wiring pattern is formed.

The technical range of the present invention is not limited to the above-described embodiment. Various modifications may be added in a range without departing from the gist of the present invention.

For example, in the above-described embodiment, as an example of the liquid ejecting apparatus, the ink jet printer 1 is described as an example. However, it is not limited to the printer. For example, a fax machine, an on-demand printer, and the like may be used as the liquid ejecting apparatus.

In the above-described embodiment, the two-row type ink jet head 5 in which two rows of nozzle holes 78 are arranged is described. However, it is not limited thereto. For example, an ink jet head 5 in which the number of rows of nozzle holes is equal to or greater than three may be provided, or an ink jet head 5 in which one row of nozzle holes is arranged may be provided.

In the above-described embodiment, among edge shoot type heads, a circulation type in which an ink is circulated between the ink jet head 5 and the ink tank 4 is described. However, it is not limited thereto. For example, the present invention may be applied to a so-called side shoot type ink jet head in which an ink is discharged from the center portion of a discharge channel in a channel extension direction.

In the above-described embodiment, a configuration in which the discharge channels 54 and the non-discharge channels 55 are alternately arranged is described. However, it is not limited to only this configuration. For example, the present invention may be applied to a so-called three-cycle type ink jet head in which an ink is discharged from all channels in order.

In the above-described embodiment, a configuration in which the Chevron type is used as the actuator plate is described. However, it is not limited thereto. That is, an actuator plate of a monopole type (polarization direction is one in the thickness direction) may be used.

In the above-described embodiment, a configuration in which the flow passage plate 41 is integrally formed of the same member is described. However, it is not limited to only this configuration. For example, the flow passage plate 41 may be formed by an assembly of a plurality of members.

In the following modification examples, components which are the same as those in the embodiment are denoted by the same reference signs, and descriptions thereof will not be repeated.

FIRST MODIFICATION EXAMPLE

Figure 23:
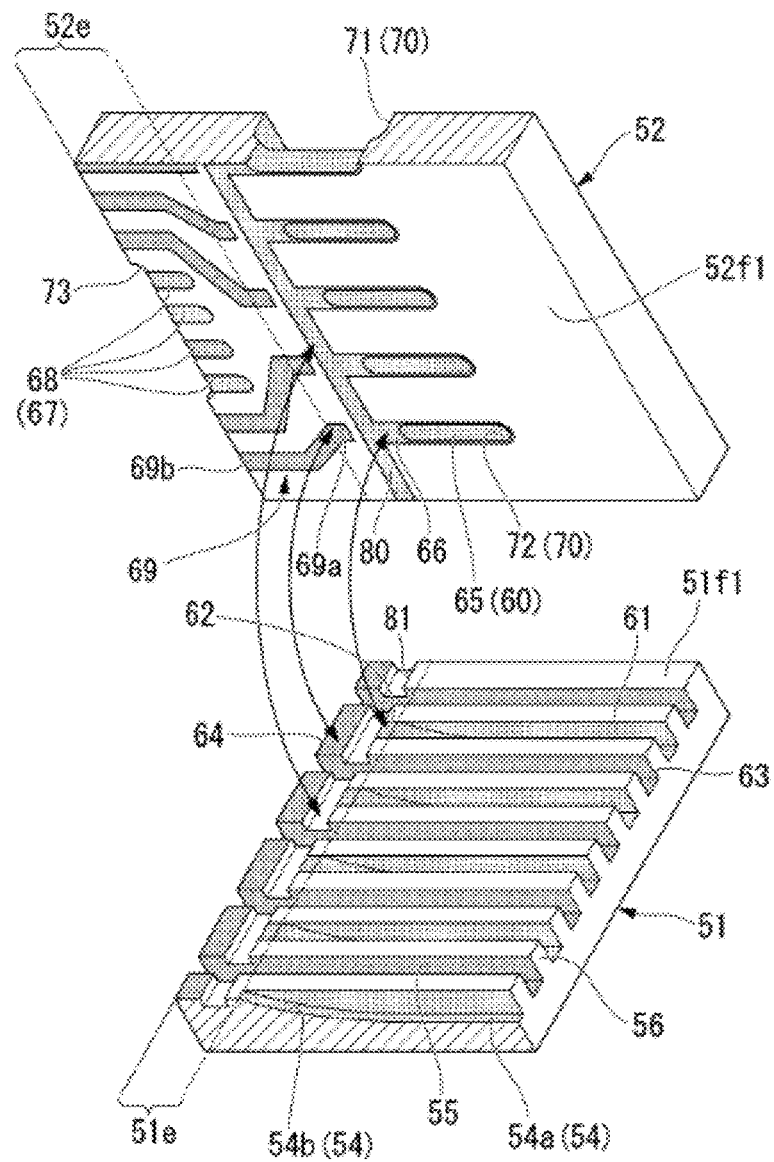
FIG. 23 is an exploded perspective view illustrating a head chip according to a first modification example of the embodiment.

For example, as illustrated in FIG. 23, a transverse common electrode 80 which is connected to the plurality of CP-side common pads 66 may be formed on the CP-side-Y-direction outer side surface 52/1. In the transverse common electrode 80, a portion of the CP-side-Y-direction outer side surface 52/1, which is positioned between the slit 72 and the CP-side individual pad 69a extends in the X-direction. The transverse common electrode 80 is formed to have a band shape in the X-direction, on the CP-side-Y-direction outer side surface 52/1. The transverse common electrode 80 is connected to upper end portions of the plurality of CP-side common pads 66, on the CP-side-Y-direction outer side surface 52/1. The transverse common electrode 80 does not abut on the CP-side individual pad 69a, on the CP-side-Y-direction outer side surface 52/1.

A clearance groove 81 (referred to as "an electrode clearance groove 81" below) of the transverse common electrode 80 may be formed in the inner side surface of the AP-side tail portion 51e in the Y-direction. In the electrode clearance groove 81, a portion of the inner side surface of the AP-side tail portion 51e in the Y-direction, which is positioned between the AP-side common pad 62 and the AP-side individual wiring 64 extends in the X-direction. The electrode clearance groove 81 faces the transverse common electrode 80 in the Y-direction. The electrode clearance groove 81 is disposed at a position corresponding to that of the transverse common electrode 80 when the actuator plate 51 and the cover plate 52 are bonded to each other. That is, when the actuator plate 51 and the cover plate 52 are bonded to each other, the transverse common electrode 80 is disposed in the electrode clearance groove 81.

In this modification example, the transverse common electrode 80 which is connected to the plurality of CP-side common pads 66 and extends in the X-direction is formed on the CP-side-Y-direction outer side surface 52/1.

According to this modification example, it is possible to preliminarily connect the plurality of CP-side common pads 66 by the transverse common electrode 80. Thus, it is possible to improve reliability for electrical connection of the plurality of CP-side common pads 66, in comparison to a case where the plurality of CP-side common pads 66 are connected to only the in-liquid-supply-passage electrode 65.

In this modification example, the electrode clearance groove 81 which extends in the X-direction and faces the transverse common electrode 80 in the Y-direction is formed in the inner side surface of the AP-side tail portion 51e in the Y-direction.

According to this modification example, when the actuator plate 51 and the cover plate 52 are bonded to each other, the transverse common electrode 80 can be accommodated in the electrode clearance groove 81. Thus, it is possible to avoid an occurrence of short circuit between the electrode on the actuator plate 51 side (for example, AP-side individual wiring 64), and the transverse common electrode 80.

SECOND MODIFICATION EXAMPLE

Figure 24:
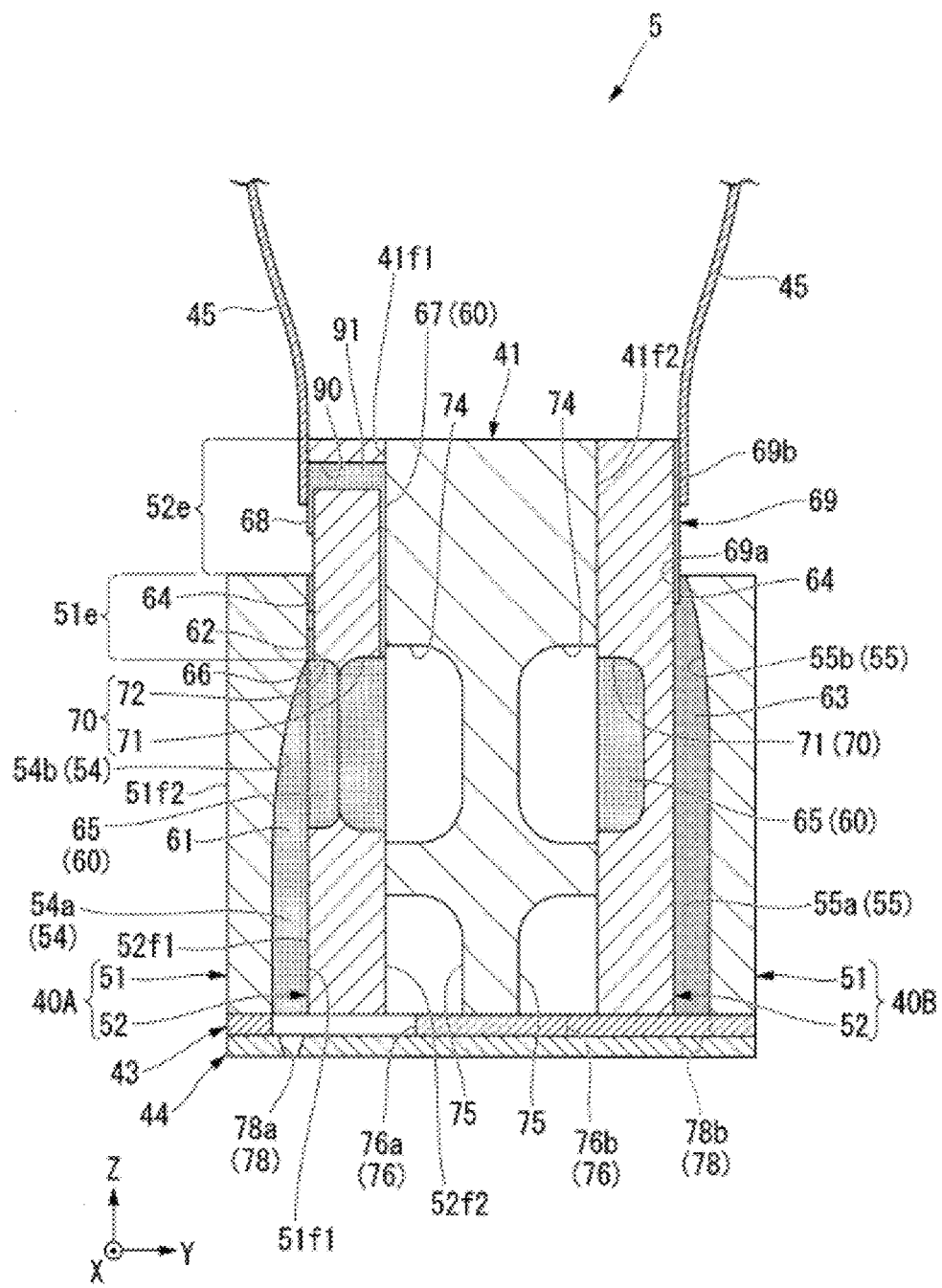
FIG. 24 is a sectional view illustrating an ink jet head according to a second modification example of the embodiment.

For example, as illustrated in FIG. 24, instead of the recess portion 73 (see FIG. 4) in the embodiment, a plurality of through-holes 90 may be formed at the upper end portion of the cover plate 52. The through-holes penetrate in the Y-direction and are arranged to be spaced from each other in the X-direction.

The common lead wiring 67 extends upwardly on the CP-side-Y-direction inner side surface 52/2 from the upper end of the common ink room 71 along the CP-side-Y-direction inner side surface 52/2. Then, the common lead wiring 67 is drawn up to the upper end portion of the CP-side-Y-direction outer side surface 52/1 through the through-hole 90 at the upper end portion of the cover plate 52. In other words, the common lead wiring 67 is drawn up to the outer side surface of the CP-side tail portion 52e in the Y-direction, through a through-electrode 91 in the through-hole 90. Thus, common electrodes 61 formed on the inner surface of each of the plurality of discharge channels 54 is electrically connected to the flexible substrate 45 in the common terminal 68, through the AP-side common pad 62, the CP-side common pad 66, the in-liquid-supply-passage electrode 65, and the common lead wiring 67.

For example, the through-electrode 91 is formed only on an inner circumferential surface of the through-hole 90 by vapor deposition or the like. The through-hole 90 may be full with the through-electrode 91 by using a conductive paste or the like.

In this modification example, the plurality of through-holes 90 which penetrate the cover plate 52 in the Y-direction and are arranged to be spaced from each other in the X-direction are formed at the upper end portion of the CP-side tail portion 52e. The common lead wiring 67 is connected to the in-liquid-supply-passage electrode 65 and the flexible substrate 45 through the through-hole 90.

According to this modification example, in comparison to a case where the common lead wiring 67 is connected to the in-liquid-supply-passage electrode 65 and the flexible substrate 45 along the recess portion 73 (see FIG. 4), it is possible to protect the common lead wiring 67 by a portion of forming the through-hole (wall portion). Thus, it is possible to avoid an occurrence of a situation in which the common lead wiring 67 in the through-hole 90 is damaged.

In addition, in the range without departing from the gist of the present invention, the components in the above-described embodiment may be appropriately substituted with known components, or the above-described modification examples may be appropriately combined.

What is claimed is:

1. A liquid ejecting head chip comprising:
    an actuator plate in which a plurality of ejection channels and a plurality of non-ejection channels which extend in a first direction are alternately arranged at a distance in a second direction which is orthogonal to the first direction;
    a cover plate which is stacked on an actuator plate-side first main surface of the actuator plate in a third direction which is orthogonal to the first direction and the second direction, so as to close the plurality of ejection channels and the plurality of non-ejection channels;
    a common electrode which is formed on an inner surface of each of the ejection channels;
    an individual electrode which is formed on an inner surface of each of the non-ejection channel; and
    a connection wiring which is divided so as to be formed in at least 3 or more places in the second direction on the cover plate, and connects the common electrode to an external wiring,
    wherein the connection wiring is formed at a tail portion of the cover plate, which extends out of one end surface of the actuator plate in the first direction, in a stacked state of the actuator plate and the cover plate.

2. The liquid ejecting head chip according to claim 1,
    wherein a liquid supply passage which penetrates the cover plate in the third direction and communicates with the ejection channel is formed in the cover plate, and
    the connection wiring includes:
        an in-liquid-supply-passage electrode which is formed on an inner surface of the liquid supply passage; and
        a lead wiring which is divided so as to be formed in at least 3 or more places in the second direction on the tail portion of the cover plate, and which connects the in-liquid-supply-passage electrode to the external wiring.

3. The liquid ejecting head chip according to claim 2,
    wherein, at one end of the cover plate in the first direction in the tail portion, a plurality of recess portions which are recessed toward the other end of the cover plate in the first direction and are disposed to be spaced from each other in the second direction are formed, and
    the lead wiring connects the in-liquid-supply-passage electrode to the external wiring through the recess portion.

4. The liquid ejecting head chip according to claim 2,
    wherein a plurality of through-holes which penetrate the cover plate in the third direction and are disposed to be spaced from each other in the second direction are formed at one end portion of the cover plate in the first direction in the tail portion, and
    the lead wiring connects the in-liquid-supply-passage electrode to the external wiring through the through-hole.

5. The liquid ejecting head chip according to claim 2,
    wherein the liquid supply passage includes a plurality of slits which are opened in a cover plate-side first main surface of the cover plate, which faces the actuator plate-side first main surface, so as to communicate with the ejection channels and which are disposed to be spaced from each other in the second direction,
    a plurality of actuator plate-side common pads which extend from the common electrodes and are disposed to be spaced from each other in the second direction are formed at a portion of the actuator plate-side first main surface, which is positioned on one side of the ejection channel in the first direction, and
    a plurality of cover plate-side common pads which extend from the in-liquid-supply-passage electrode, are disposed to be spaced from each other in the second direction, and respectively face the actuator plate-side common pads in the third direction are formed around the slits in the cover plate-side first main surface.

6. The liquid ejecting head chip according to claim 5,
    wherein a transverse common electrode which is connected to the plurality of cover plate-side common pads and extends in the second direction is formed on the cover plate-side first main surface.

7. The liquid ejecting head chip according to claim 6,
    wherein an electrode clearance groove which extends in the second direction and faces the transverse common electrode in the third direction is formed at a portion of the actuator plate-side first main surface, which is positioned on one side of the ejection channel in the first direction.

8. The liquid ejecting head chip according to claim 2,
    wherein the lead wiring includes a common terminal which is divided so as to be formed in at least 3 or more places in the second direction on a cover plate-side first main surface facing the actuator plate-side first main surface at the tail portion of the cover plate, and which is connected to the external wiring.

9. The liquid ejecting head chip according to claim 1,
    wherein, on the actuator plate-side first main surface, an actuator plate-side individual wiring which extends in the second direction at one end portion thereof in the first direction, and connects individual electrodes which face each other with the ejection channel interposed between the individual electrodes is formed,
    in the cover plate, a cover plate-side individual wiring which is divided in the second direction at the one end portion thereof in the first direction is formed on the cover plate-side first main surface which faces the actuator plate-side first main surface, and
    the cover plate-side individual wiring includes:
        a cover plate-side individual pad which faces the actuator plate-side individual wiring in the third direction; and
        an individual terminal which extends from the cover plate-side individual pad toward one end in the first direction.

10. A liquid ejecting head comprising:

the liquid ejecting head chip according to claim 1.

11. The liquid ejecting head according to claim 10, further comprising a pair of liquid ejecting head chips which are disposed such that a cover plate-side second main surface on a side of one cover plate, which is opposite to the cover plate-side first main surface which faces the actuator plate-side first main surface faces a cover plate-side second main surface on the side of the other cover plate, in the third direction, wherein a liquid supply passage which penetrates the cover plate in the third direction and communicates with the ejection channel is formed in the cover plate, a flow passage plate is disposed between the pair of liquid ejecting head chips, and an inlet flow passage which communicates with liquid supply passages of the pair of the cover plates is formed in the flow passage plate.

12. The liquid ejecting head according to claim 11, wherein each of the plurality of ejection channels is opened in the other end surface of the actuator plate in each of the pair of liquid ejecting head chips in the first direction, an ejection plate which has ejection holes which respectively communicate with the ejection channels is disposed on the other end side of each of the pair of actuator plates in the first direction, a return plate which has circulation passages which cause the ejection channels to respectively communicate with the ejection holes is disposed between the pair of actuator plates and the ejection plate in the first direction, and an outlet flow passage which communicates with the circulation passages is formed in the flow passage plate.

13. A liquid ejecting apparatus comprising:

the liquid ejecting head according to claim 10; and a moving mechanism that relatively moves the liquid ejecting head and a recording medium.

* * * * *